United States Patent
Kang et al.

(10) Patent No.: US 7,733,718 B2
(45) Date of Patent: Jun. 8, 2010

(54) ONE-TRANSISTOR TYPE DRAM

(75) Inventors: Hee Bok Kang, Cheongju-si (KR); Jin Hong An, Yongin-si (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 72 days.

(21) Appl. No.: 12/003,828

(22) Filed: Jan. 2, 2008

(65) Prior Publication Data

US 2009/0010052 A1    Jan. 8, 2009

(30) Foreign Application Priority Data

Jul. 4, 2007   (KR) ............... 10-2007-0067036
Jul. 4, 2007   (KR) ............... 10-2007-0067050

(51) Int. Cl.
 *G11C 7/00* (2006.01)
(52) U.S. Cl. ............. 365/196; 365/189.08; 365/189.15; 365/189.06; 365/189.09; 365/205; 365/210.1
(58) Field of Classification Search ................ 365/196, 365/189.08, 189.15, 189.06, 189.09, 205, 365/210.1
See application file for complete search history.

(56) References Cited

U.S. PATENT DOCUMENTS

| | | | | |
|---|---|---|---|---|
| 4,388,705 A | * | 6/1983 | Sheppard | 365/210.12 |
| 4,745,580 A | * | 5/1988 | Laymoun et al. | 365/179 |
| 6,128,219 A | * | 10/2000 | Pio et al. | 365/185.09 |
| 6,236,598 B1 | * | 5/2001 | Chou | 365/189.06 |
| 6,836,443 B2 | * | 12/2004 | Dadashev | 365/189.07 |

(Continued)

FOREIGN PATENT DOCUMENTS

KR   10-2006-0016936    5/2007

(Continued)

OTHER PUBLICATIONS

Notice of Rejection for Korean Patent Application No. 10-2007-0067036, dated Jun. 18, 2008.

(Continued)

*Primary Examiner*—Viet Q Nguyen
(74) *Attorney, Agent, or Firm*—IP & T Law Firm PLC

(57) ABSTRACT

A one-transistor type DRAM including a floating body storage element connected between a bit line and a source line and controlled by a word line comprises a plurality of source lines and word lines arranged in a row direction, a plurality of bit lines arranged in a column direction, a plurality of clamp bit lines and reference bit lines arranged in a column direction, a cell array including the floating body storage element and formed in a region where the source line, the word line and the bit line are crossed, a clamp cell array including the floating body storage element and formed in a region where the source line, the word line and the bit line are crossed, a reference cell array including the floating body storage element and formed in a region where the source line, the word line and the bit line are crossed, and a sense amplifier and a write driving unit connected to the bit line and configured to receive a clamp voltage and a reference voltage.

12 Claims, 23 Drawing Sheets

U.S. PATENT DOCUMENTS

| | | | |
|---|---|---|---|
| 6,853,599 B2 * | 2/2005 | Oh et al. | 365/158 |
| 6,888,770 B2 * | 5/2005 | Ikehashi | 365/205 |
| 6,982,908 B2 | 1/2006 | Cho | |
| 6,999,345 B1 * | 2/2006 | Park et al. | 365/185.18 |
| 7,027,334 B2 * | 4/2006 | Ikehashi et al. | 365/189.07 |
| 7,050,346 B2 * | 5/2006 | Maejima et al. | 365/189.14 |
| 7,196,943 B2 * | 3/2007 | Mirichigni et al. | 365/189.06 |
| 7,251,163 B2 | 7/2007 | O | |
| 7,301,838 B2 * | 11/2007 | Waller et al. | 365/205 |
| 7,352,645 B2 * | 4/2008 | Sforzin et al. | 365/227 |
| 7,486,563 B2 * | 2/2009 | Waller et al. | 365/185.21 |
| 7,630,262 B2 * | 12/2009 | Kang et al. | 365/207 |
| 2009/0010079 A1 * | 1/2009 | Kang et al. | 365/189.09 |

FOREIGN PATENT DOCUMENTS

| | | |
|---|---|---|
| KR | 100773349 B1 | 10/2007 |
| KR | 100800156 B1 | 1/2008 |

OTHER PUBLICATIONS

Notice of Allowance issued from Korean Intellectual Property Office on Sep. 1, 2009 with an English Translation.

* cited by examiner even μm. In a semiconductor device integrated in the SOI wafer, a smaller junction capacity facilitates high speed operation in comparison with a semiconductor device integrated in a general silicon wafer, and a low voltage due to a low threshold satisfies high speed operation and low voltage.

ONE-TRANSISTOR TYPE DRAM

RELATED APPLICATIONS

This application is based upon and claims the benefit of priority to Korean Patent Application Nos. 10-2007-0067050, filed on Jul. 4, 2007, and 10-2007-0067036, filed on Jul. 4, 2007. The entire contents of these applications are incorporated herein by reference.

TECHNICAL FIELD

The present invention generally relates to a one-transistor type DRAM, and more specifically, to a one-transistor type DRAM including a floating body storage element to improve sensing efficiency of a sense amplifier.

BACKGROUND

Generally, a semiconductor device such a DRAM is integrated over a silicon wafer. However, in the silicon wafer used in the semiconductor device, the whole silicon is not used in the operation of the device, but a limited thickness of the device, e.g. several μm from the surface is used. As a result, the rest silicon wafer except a portion required in the operation of the device increases power consumption and degrades a driving speed.

A Silicon On Insulator (SOI) wafer has been required which includes an insulating layer in a silicon substrate to obtain a silicon single crystal layer having thickness of several μm. In a semiconductor device integrated in the SOI wafer, a smaller junction capacity facilitates high speed operation in comparison with a semiconductor device integrated in a general silicon wafer, and a low voltage due to a low threshold satisfies high speed operation and low voltage.

However, the sensing efficiency of the sense amplifier is degraded when a reference voltage of an integrated semiconductor device in the SOI wafer is not effectively controlled. As a result, a data sensing margin and a yield of the chip are degraded. Furthermore, a conventional one-transistor type DRAM cell cannot store multi level data not to perform effective read/write operations.

SUMMARY

Consistent with the present invention, there is provided a one-transistor type DRAM including a floating body storage element connected between a bit line and a source line and controlled by a word line, the DRAM comprising a plurality of source lines and word lines arranged in a row direction, a plurality of bit lines arranged in a column direction, a plurality of clamp bit lines and reference bit lines arranged in the column direction, a cell array including the floating body storage element and formed in a region where the source line, the word line and the bit line are crossed, a clamp cell array including the floating body storage element and formed in a region where the source line, the word line and the clamp bit line are crossed, a reference cell array including the floating body storage element and formed in a region where the source line, the word line and the reference bit line are crossed, and a sense amplifier and a write driving unit connected to the bit line and configured to receive a clamp voltage and a reference voltage.

Consistent with the present invention, there is also provided a one-transistor type DRAM including a floating body storage element connected between a bit line and a source line and controlled by a word line, the DRAM comprising a plurality of source lines and word lines arranged in a row direction, a plurality of bit lines arranged in a column direction, a plurality of reference bit lines arranged in a column direction, a cell array including the floating body storage element and formed in a region where the source line, the word line and the bit line are crossed, a reference cell array including the floating body storage element and formed in a region where the source line, the word line and the reference bit line are crossed so as to output a plurality of different reference voltages, and a sense amplifier and a write driving unit connected to the bit line and configured to receive the plurality of reference voltages.

DETAILED DESCRIPTION

Figure 1:
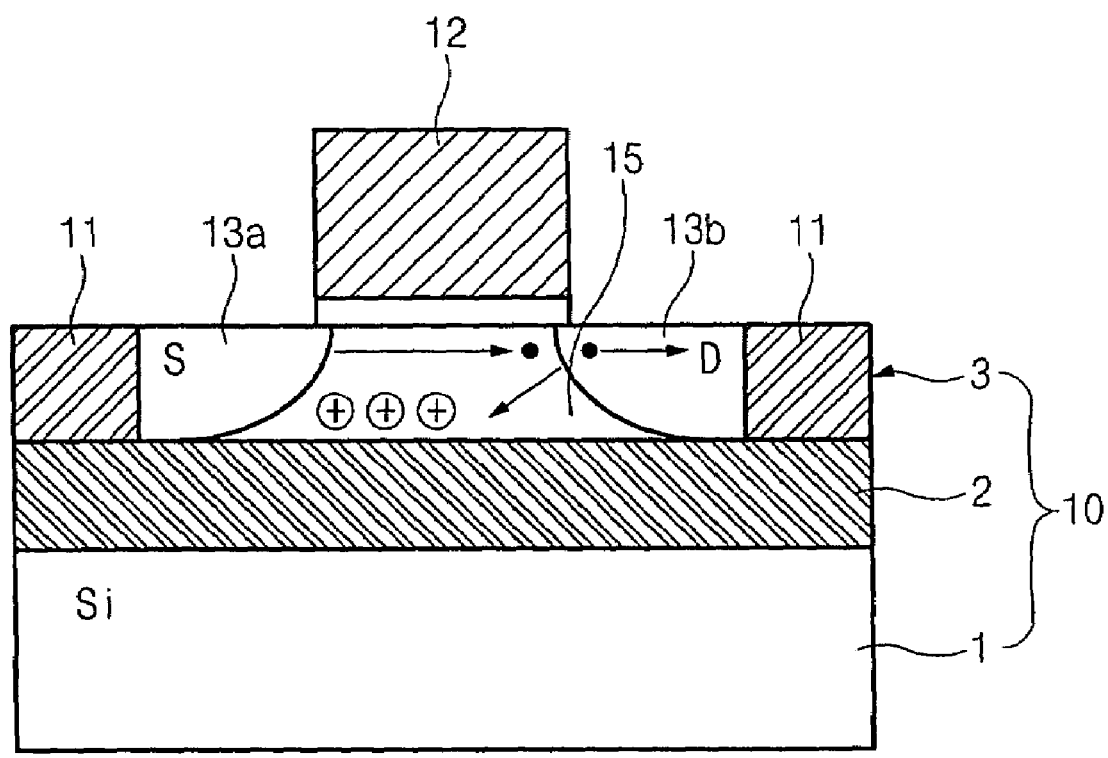
FIG. 1 is a cross-sectional diagram illustrating a unit cell of a one-transistor type DRAM.

FIG. 1 is a cross-sectional diagram illustrating a unit cell of a one-transistor type DRAM.

A silicon on insulator (SOI) wafer 10 includes a stacked structure including a silicon substrate 1, a buried oxide layer 2 and a silicon layer 3. A device isolation film 11 that defines an active region in the silicon layer 3 of SOI wafer 10 is formed to contact with buried oxide layer 2.

A gate 12 is formed over the active region of silicon layer 3. Source/drain regions 13a and 13b are formed to contact with buried oxide film 2 in silicon layer 3 located at both sides of gate 12.

A DRAM cell of SOI wafer 10 captures holes and electrons in a floating body 15 corresponding to a channel region under the gate 12 to store data.

Figure 2A:
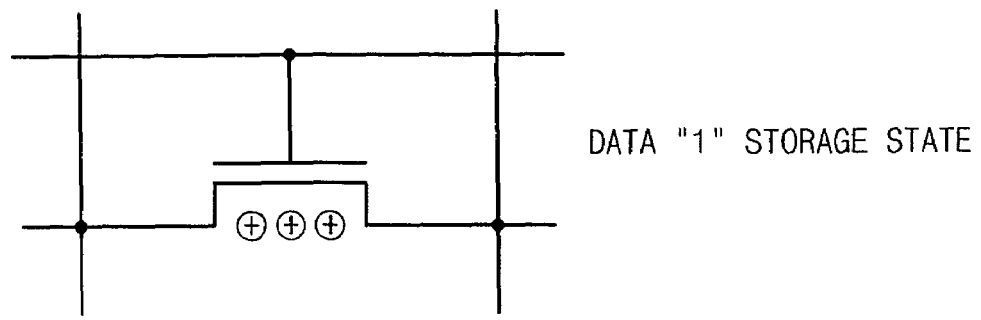
FIGS. 2a and 2b are diagrams illustrating a cell data storage state of a one-transistor type DRAM.
Figure 2B:
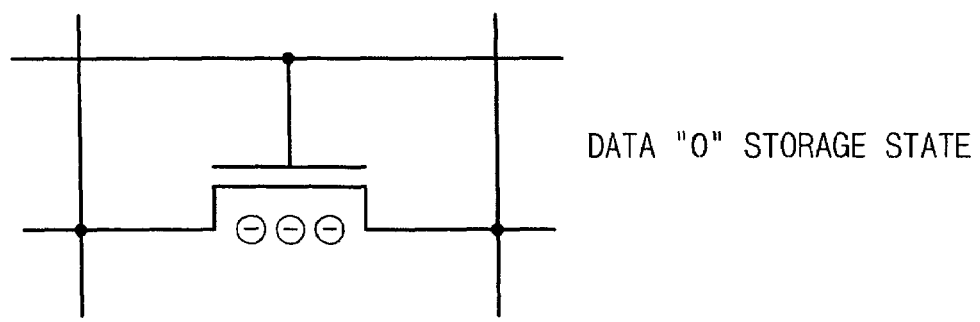

As shown in FIG. 2a, the data "1" storage state means that there are many holes in floating body 15. As shown in FIG. 2b, the data "0" storage state means that there is the small number of holes or the large number of electrons.

Figure 3:
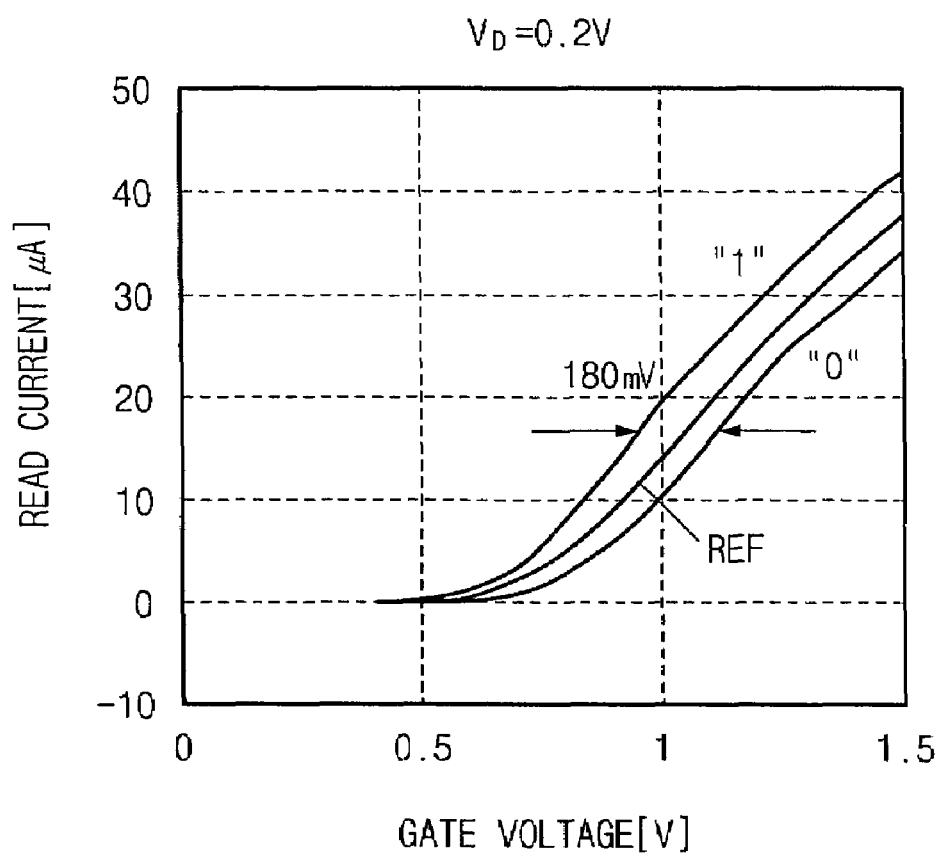
FIG. 3 is a waveform diagram illustrating a characteristic of a cell read current of a one-transistor type DRAM.

FIG. 3 is a waveform diagram illustrating a characteristic of a cell read current of a one-transistor type DRAM.

The graph of FIG. 3 illustrates a cell read current when a cell gate voltage is swept while a cell drain voltage Vd is 0.2V, a cell source voltage is grounded in a DRAM cell of the SOI wafer 10.

When a word line read voltage is applied to word line WL, a read current flows from bit line BL into source line SL. The data "1" is read when the amount of flowing sensing current is larger than a reference current, and the data "0" is read when it is smaller than the reference current.

At the read mode of the one-transistor type cell, a larger amount of sensing current flows in the data "1" storage state than in the data "0" storage state. That is, the data "1" storage state has the largest amount of read current, and the data "0" storage state has the smallest amount of read current. Reference current REF has a read current value corresponding to a middle value between the data "1" storage state and the data "0" storage state.

Figure 4A:
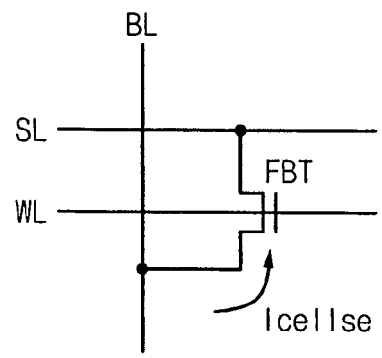
FIG. 4a is a circuit diagram illustrating a read method of a one-transistor type DRAM consistent with the present invention.

FIG. 4a is a circuit diagram illustrating a read method of a one-transistor type DRAM consistent with the present invention.

In one embodiment consistent with the present invention, one-transistor type DRAM comprises a floating body transistor FBT having a source 13a and a drain 13b connected to a source line SL and a bit line BL, and a gate 12 connected to a word line WL.

Figure 4B:
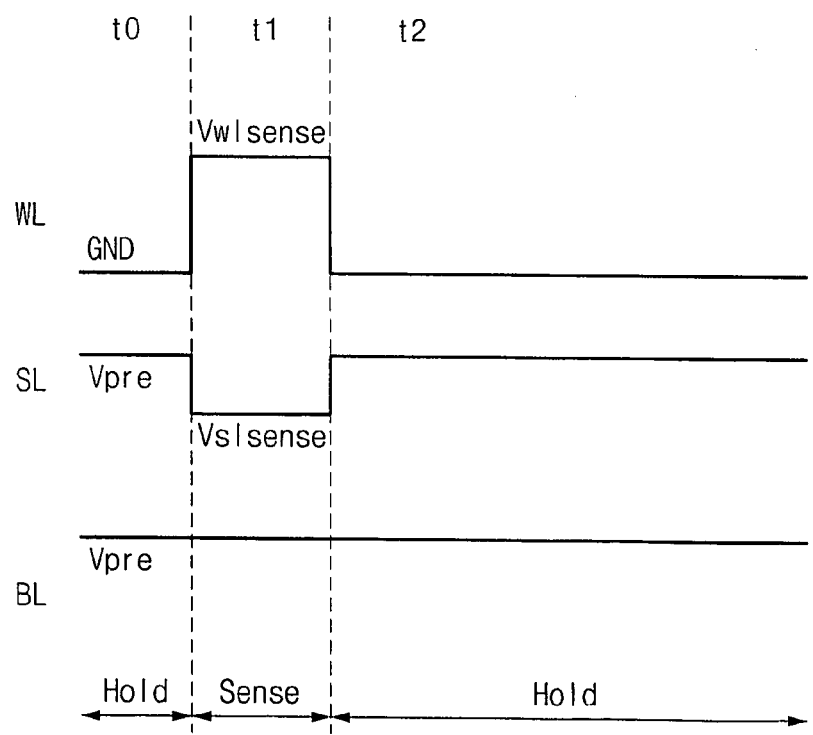
FIG. 4b is a timing diagram illustrating the operation of FIG. 4a consistent with the present invention.

FIG. 4b is a timing diagram illustrating the operation of FIG. 4a.

In one-transistor type DRAM cell, a timing for reading data includes periods t0~t2. Data are held in the periods t0, t2. Data are read in the period t1.

In the period t0, that is, a first hold period, word line WL is maintained at a ground GND level. Source line SL and bit line BL are maintained at a pre-charge voltage Vpre level. In the period t0, data are held in the floating body 15.

In the period t1, a voltage of the word line WL transits to a word line sensing voltage Vwlsense level in order to read data stored in the cell. A voltage of source line SL transits to a source line sensing voltage Vslsense level, and a voltage of bit line BL is maintained at a pre-charge voltage Vpre level. As a result, a sensing current Icellse flows to sense a sensing current from bit line BL to source line SL.

That is, a drain source voltage Vds for sensing the sensing current Icellse is transmitted between bit line BL and source line SL to read cell data.

In period t2, that is, a second hole period, word line WL transits to ground voltage GND level. Source line SL transits to pre-charge voltage Vpre level, and bit line BL is maintained at pre-charge voltage Vpre level.

Word line sensing voltage Vwlsense has a level higher than that of ground voltage GND. The source line sensing voltage Vslsense has a level lower than that of pre-charge voltage Vpre and higher than that of the ground voltage GND.

Figure 5:
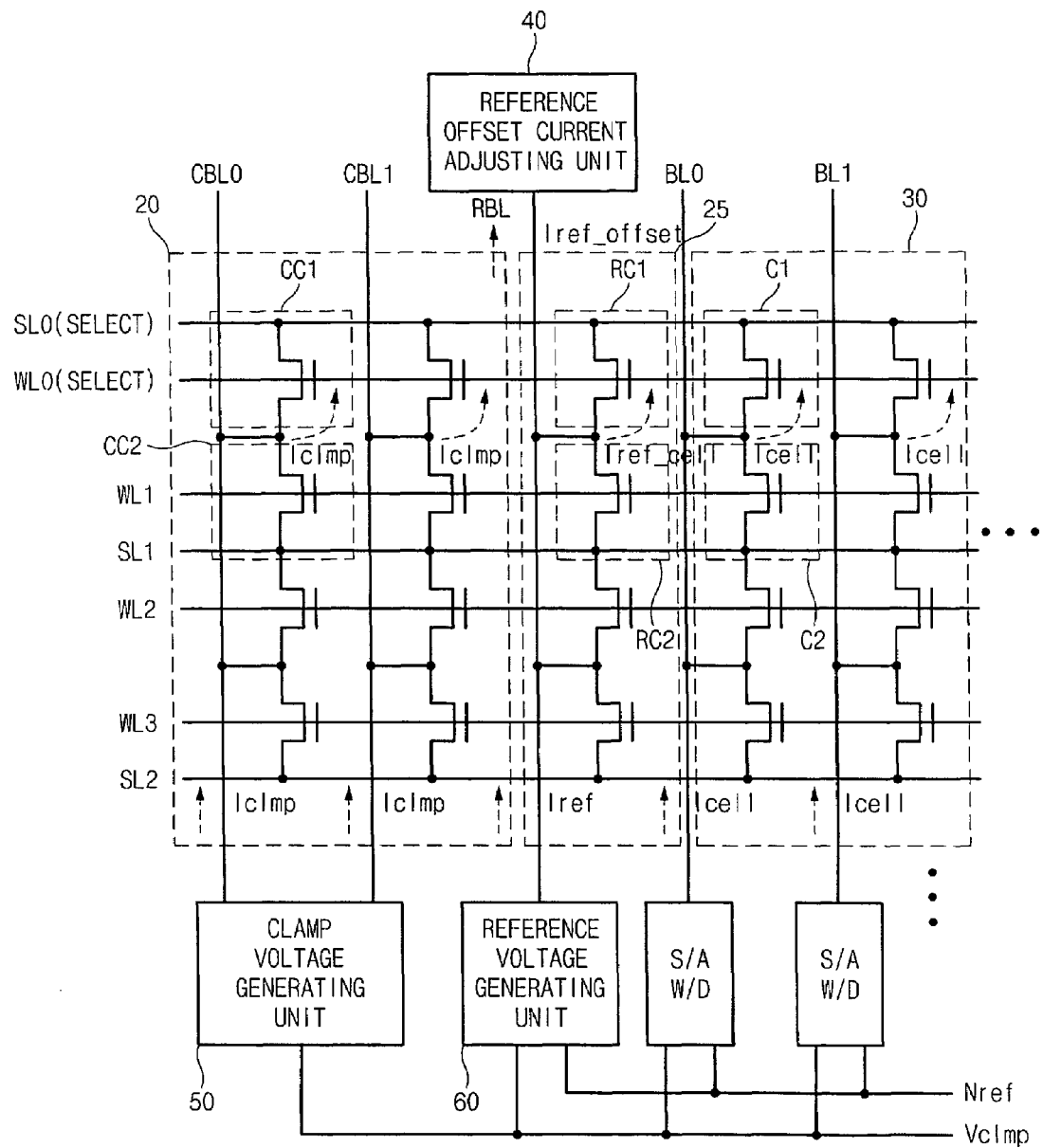
FIGS. 5 and 6 are circuit diagrams illustrating a one-transistor type DRAM consistent with the present invention.

FIG. 5 is a circuit diagrams illustrating a one-transistor type DRAM consistent with the present invention.

One-transistor type DRAM of FIG. 5 comprises a cell array 20, a reference cell array 25, a cell array 30, a reference offset current adjusting unit 40, a clamp voltage generating unit 50, a reference voltage generating unit 60, a sense amplifier S/A and a write driving unit W/D.

Clamp cell array 20 includes a plurality of source lines SL0~SL2 and a plurality of word lines WL0~WL3 which are arranged in a row direction. Clamp bit lines CBL0, CBL1 are arranged in a column direction.

Reference cell array 25 includes plurality of source lines SL0~SL2 and plurality of word lines WL0~WL3 which are arranged in a row direction. A reference bit line RBL is arranged in a column direction. Clamp cell array 20 includes a clamp cell CC which reflects a characteristic of a main cell so as to generate a clamp voltage. Reference cell array 25 includes a reference cell RC to generate a reference voltage, thereby increasing efficiency of the sense amplifier.

In the clamp cell array 20, clamp cells CC1, CC2, connected between source line SL0 and source line SL1, have a common drain to share clamp bit line CBL0. Clamp cells CC1, CC2 have a gate connected to word lines WL0, WL1. Clamp cells CC1, CC2 arranged up and down have a source connected to different source lines SL0, SL1.

Cells of clamp cell array 20 store data "0". The same current as that of the cell data "0" flows through clamp bit lines CBL0, CBL1.

Reference cells RC1, RC2, connected between source line SL0 and source line SL1, have a common drain to share reference bit line RBL. Reference cells RC1, RC2 have a gate connected to word lines WL0, WL1. Reference cells RC1, RC2 arranged up and down have a source connected to different source lines SL0, SL1.

Cells of reference cell array 20 store data "0". The same current as that of the cell data "0" flows through reference bit line RBL.

Cell array 30 includes plurality of source lines SL0~SL2 and plurality of word lines WL0~WL3 which are arranged in a row direction. A plurality of bit lines BL0, BL1 are arranged in a column direction.

In cell array 30, cells C1, C2, connected between source line SL0 and source line SL1, have a common drain to share bit line BL0. Cells C1, C2 have a gate connected to word lines WL0, WL1. Cells C1, C2 arranged up and down have a source connected to different source lines SL0, SL1.

Source line sensing voltage Vslsense, which is a sensing bias voltage for sensing a sensing current of the cell, is applied between bit line BL and source line SL. As a result, cell sensing current Icell flows depending on a storage state of cell data.

Reference offset current adjusting unit 40 is connected to reference bit lie RBL and configured to adjust a reference offset current Iref_offset flowing in referent bit line RBL.

Clamp voltage generating unit 50 shared by clamp bit lines CBL0, CBL1 controls a clamp current Iclmp flowing in clamp bit lines CBL0, CBL1 to generate a clamp voltage Vclmp.

Reference voltage generating unit 60 connected to reference bit line RBL receives clamp voltage Vclmp and controls reference current Iref flowing into reference bit line RBL to generate a reference voltage Nref.

Bit line BL0, BL1 are connected to sense amplifier S/A and write driving unit W/D. Bit lines BL0, BL1 correspond one by one to sense amplifier S/A and write driving unit W/D. Sense amplifier S/A and write driving unit W/D receive reference voltage Nref and clamp voltage Vclmp for distinguishing sensing voltages to control cell current Icell.

Sense amplifier S/A senses the cell data to distinguish the data "0" from the data "1". Write driving unit W/D supplies a driving voltage corresponding to write data to bit line BL when data are written in the cell.

Figure 6:
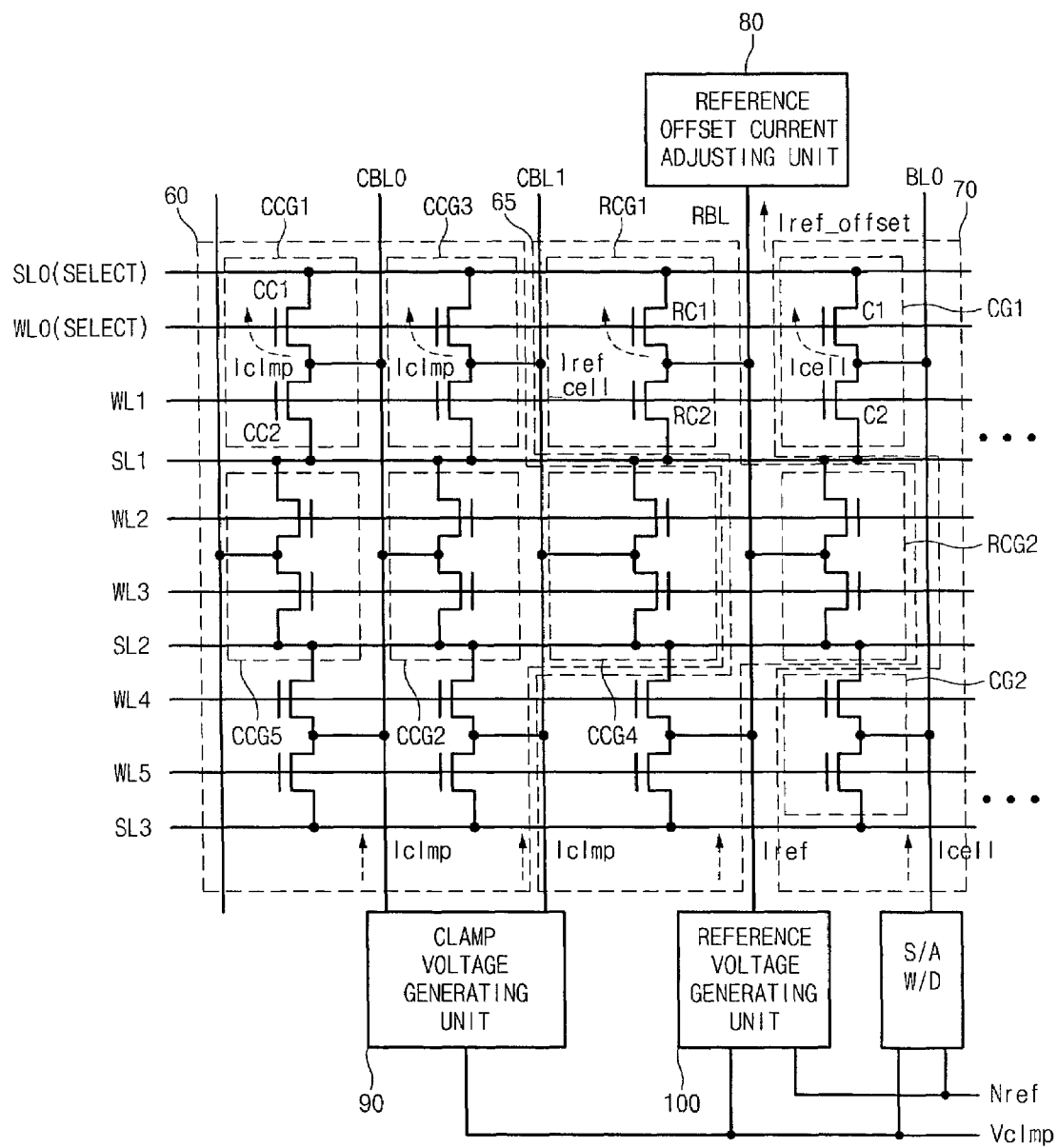

FIG. 6 is a circuit diagrams illustrating a one-transistor type DRAM consistent with the present invention.

One-transistor type DRAM of FIG. 6 comprises a cell array 60, a reference cell array 65, a cell array 70, a reference offset current adjusting unit 80, a clamp voltage generating unit 90, a reference voltage generating unit 100, a sense amplifier S/A and a write driving unit W/D.

Clamp cell array 60 includes a plurality of source lines SL0~SL3 and a plurality of word lines WL0~WL5 which are arranged in a row direction. Clamp bit lines CBL0, CBL1 are arranged in a column direction.

Reference cell array 65 includes plurality of source lines SL0~SL3 and plurality of word lines WL0~WL5 which are arranged in a row direction. A reference bit line RBL is arranged in a column direction.

In clamp cell array 60, clamp cells CC1, CC2, connected between source line SL0 and source line SL1, have a common drain to share clamp bit line CBL0. Clamp cells CC1, CC2 have a gate connected to word lines WL0, WL1. Clamp cells CC1, CC2 arranged up and down have a source connected to the different source lines SL0, SL1.

In reference cell array 65, reference cells RC1, RC2, connected between source line SL0 and source line SL1, have a common drain to share reference bit line RBL. Reference cells RC1, RC2 have a gate connected to word lines WL0, WL1. Reference cells RC1, RC2 arranged up and down have a source connected to the different source lines SL0, SL1.

Cells of clamp cell array 60 and reference cell array 65 store data "0". The same current as that of the data "0" flows through clamp bit lines CBL0, CBL1 and reference bit line RBL.

Cell array 70 includes plurality of source lines SL0~SL3 and plurality of word lines WL0~WL5 which are arranged in a row direction. A plurality of bit lines BL0, BL1 are arranged in a column direction.

In cell array 70, cells C1, C2, connected between source line SL0 and source line SL1, have a common drain to share bit line BL0. Cells C1, C2 have a gate connected to word lines WL0, WL1. Cells C1, C2 arranged up and down have a source connected to the different source lines SL0, SL1.

Source line sensing voltage Vslsense, which is a sensing bias voltage for sensing a sensing current of the cell, is applied between bit line BL and source line SL. As a result, cell sensing current Icell flows depending on a storage state of cell data.

Reference offset current adjusting unit 80 is connected to reference bit lie RBL and configured to adjust a reference offset current Iref_offset flowing into referent bit line RBL.

Clamp voltage generating unit 90 shared by clamp bit lines CBL0, CBL1 controls a clamp current Iclmp flowing into clamp bit lines CBL0, CBL1 to generate a clamp voltage Vclmp.

Reference voltage generating unit 100 connected to reference bit line RBL receives clamp voltage Vclmp and controls reference current Iref flowing into reference bit line RBL to generate a reference voltage Nref.

Bit lines BL0, BL1 are connected to sense amplifier S/A and write driving unit W/D. Bit lines BL0, BL1 correspond one by one to the sense amplifier S/A and the write driving unit W/D. Sense amplifier S/A and write driving unit W/D receive reference voltage Nref and clamp voltage Vclmp to control cell current Icell.

Sense amplifier S/A senses the cell data to distinguish the data "0" from the data "1". Write driving unit W/D supplies a driving voltage corresponding to write data to bit line BL when data are written in the cell.

Clamp cell array 60 includes a plurality of clamp cell groups CCG1, CCG2 connected to clamp bit line CBL0 and a plurality of clamp cell groups CCG3, CCG4 connected to clamp bit line CBL1. Reference cell array 65 includes reference cell groups RCG1 and RCG2 connected to reference bit line RBL. Cell array 70 includes a plurality of cell groups CG1, CG2 connected to bit line BL.

Clamp cell groups CCG1, CCG2 connected to clamp bit line CBL0 are alternately arranged in row and column directions.

The plurality of clamp cell groups CCG3, CCG4 connected to clamp bit line CBL1 are alternately arranged in row and column directions.

Reference cell groups RCG1, RCG2 connected to reference bit line RBL are alternately arranged in row and column directions. Plurality of cell groups CG1, CG2 connected to bit line BL are alternately arranged in row and column directions.

Cell groups CCG1, CCG2 arranged up and down share one source line SL1. Source line SL1 is shared by clamp cell groups CCG1, CCG3, reference cell group RCG1 and cell group CG1 which are arranged in the same row line.

Clamp bit lines CBL0 or CBL1 is connected to cell groups CCG2, CCG3 which are arranged in the same column line and connected adjacently to source line SL1. That is, clamp cell group CCG3 arranged over source line SL1 is connected to clamp bit line CBL1, and clamp cell group CCG2 arranged below source line SL1 is connected to clamp bit line CBL0.

When several cells arranged up and down share the same bit line, a bias voltage is applied to bit line BL while source line SL1 is shared in a write mode. The same voltage is applied to floating body cells arranged up and down. As a result, the same bias voltage is applied to selected cells and unselected cells so that an operating error occurs in the unselected cells.

Cell groups CG3, CG2 arranged up and down are connected to clamp bit lines CBL1, CBL0. The bias voltage is applied to the selected cells, and the bias voltage from the bit line is not applied in the unselected cells, thereby preventing an operating error of the cell.

A clamp cell group CCG5 is not connected to clamp bit line CBL, but is disposed in the cell array to make process be convenience. A bias condition applied to each cell can be differentiated by changing the arrangement of the cell groups as shown in FIG. 6.

Figure 7:
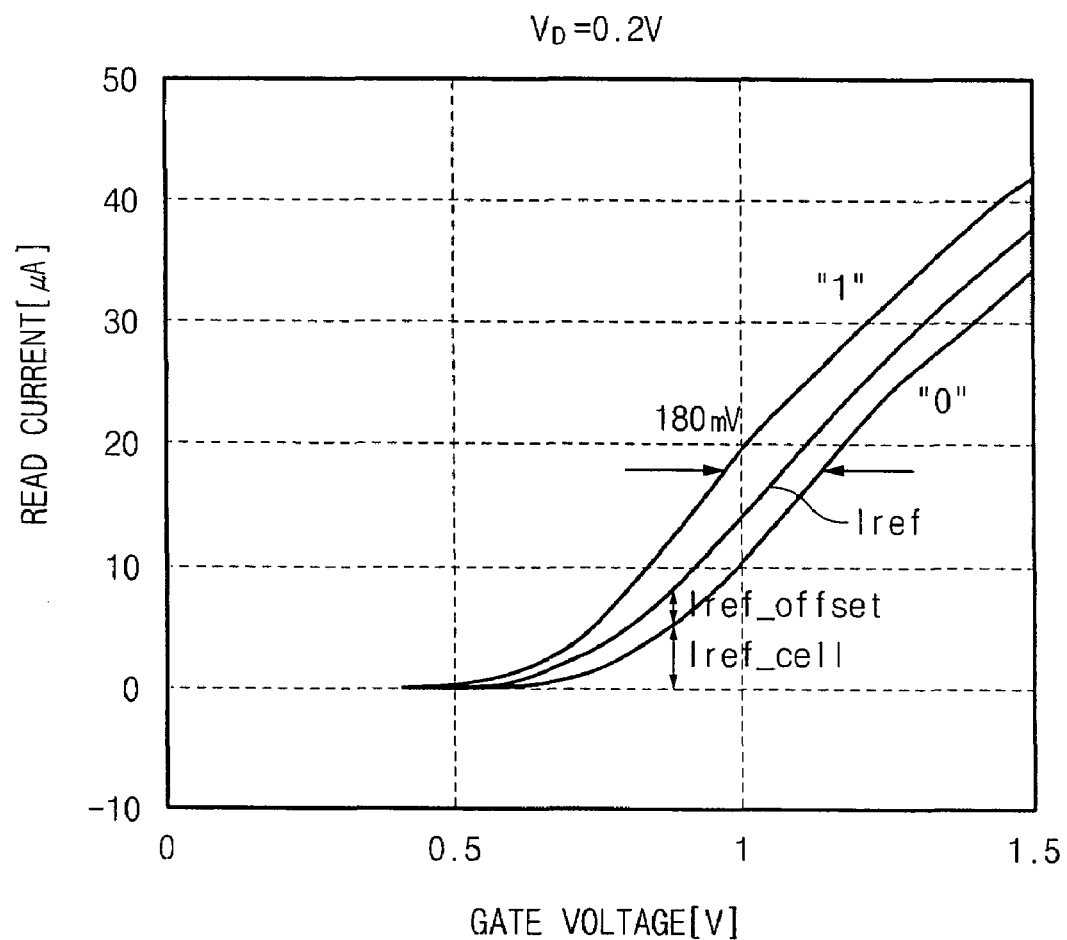
FIG. 7 is a waveform diagram illustrating a reference current of a one-transistor type DRAM consistent with the present invention.

FIG. 7 is a waveform diagram illustrating a reference current of a one-transistor type DRAM consistent with the present invention.

In the period t1 of FIG. 4b, when the voltage of word line WL transits to word line sensing voltage Vwlsense level, the same reference current Iref_cell as that of the data "0" flows into reference cell RC of clamp reference cell array 20.

In the reference offset current adjusting unit 40, an additional current element is generated to generate reference current Iref corresponding to a middle value of the cell data "1" and the cell data "0".

The additional current element is defined by reference offset current Iref_offset. The whole reference current Iref includes reference current Iref_cell and reference offset current Iref_offset.

Figure 8:
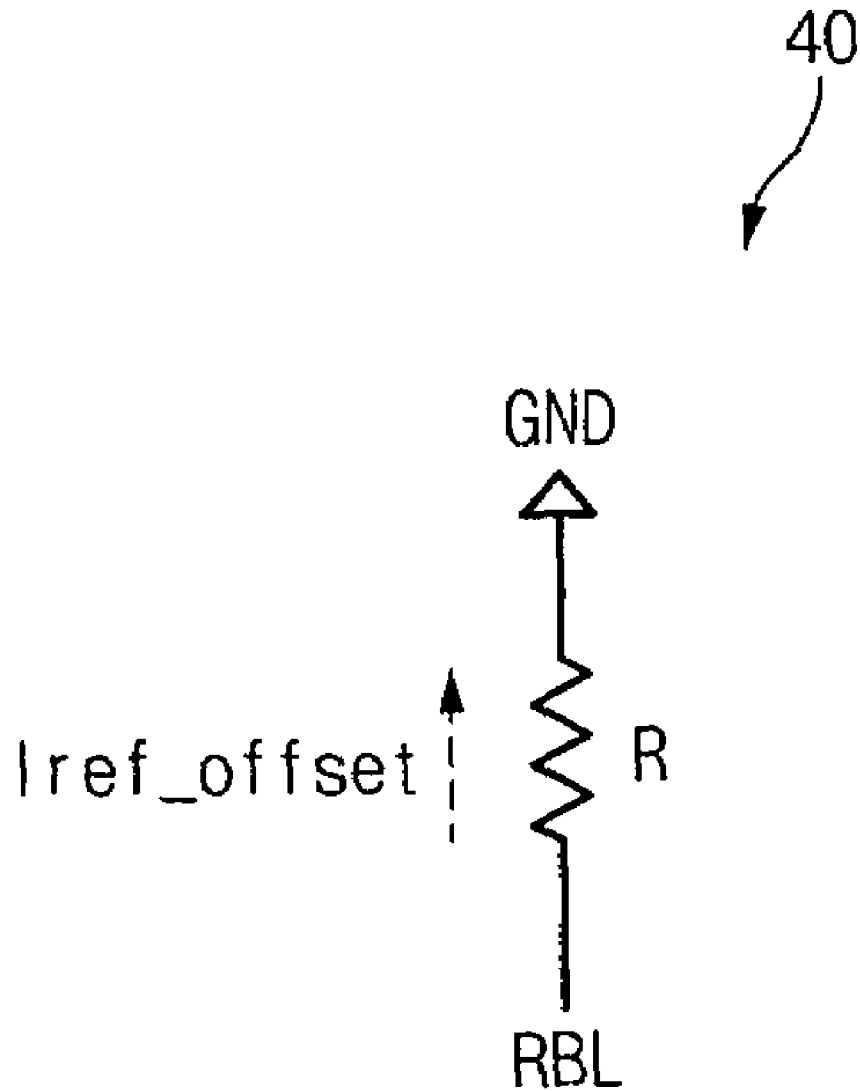
FIG. 8 is a circuit diagram illustrating a reference offset current adjusting unit of FIGS. 5 and 6 consistent with the present invention.

FIG. 8 is a circuit diagram illustrating reference offset current adjusting units 40 and 80 of FIGS. 5 and 6. In the embodiment, the reference offset current adjusting unit 40 is shown.

Reference offset current adjusting unit 40 includes an offset current control element connected between reference bit line RBL and ground GND voltage terminal. The offset current control element adjusts flowing of reference offset current Iref_offset flowing from reference voltage generating unit 60 through reference bit line RBL to ground GND terminal.

Although the offset current control element includes a resistor R in the embodiment, the offset current control element may be configured with a MOS element or any other elements whose resistance can be adjusted.

Figure 9:
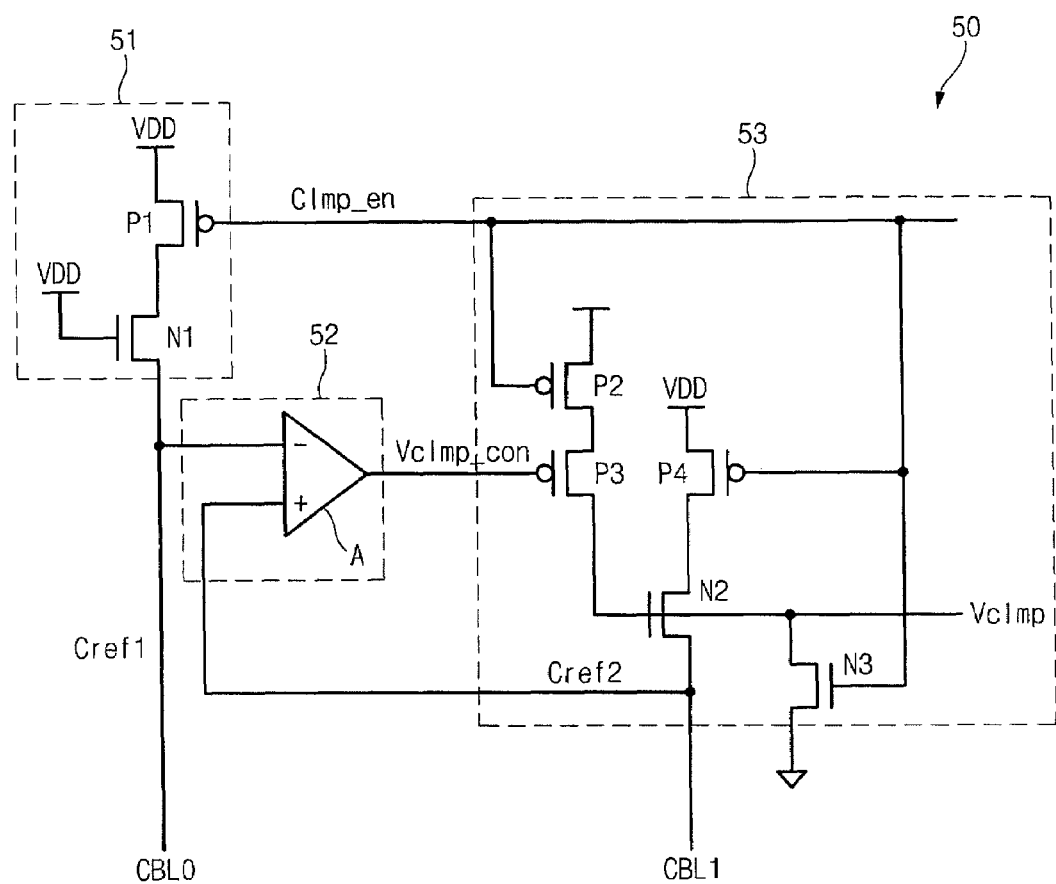
FIG. 9 is a circuit diagram illustrating a clamp voltage generating unit of FIGS. 5 and 6 consistent with the present invention.

FIG. 9 is a circuit diagram illustrating clamp voltage generating units 50 and 90 of FIGS. 5 and 6. In the embodiment, clamp voltage generating unit 50 is exemplified.

Clamp voltage generating unit 50 includes a reference bias unit 51, a clamp voltage adjusting unit 52 and a clamp voltage output unit 53.

Reference bias unit 51 includes a PMOS transistor P1 and a NMOS transistor N1. PMOS transistor P1, connected between a power voltage VDD terminal and NMOS transistor N1, has a gate to receive a clamp enable signal Clmp_en. NMOS transistor N1, connected between PMOS transistor P1 and clamp bit line CBL0, has a gate to receive a power voltage VDD.

Clamp voltage adjusting unit 52 including an amplifier A outputs a clamp voltage control signal Vclmp_con. The amplifier A has a negative (−) terminal connected to clamp bit line CBL0 and configured to receive a clamp reference signal Cref1. Amplifier A has a positive (+) terminal connected to clamp bit line CBL1 and configured to receive a clamp reference signal Cref2.

Clamp voltage output unit 53 includes PMOS transistors P2~P4, NMOS transistors N2, N3. PMOS transistor P2, connected between power voltage terminal and PMOS transistor P3, has a gate to receive the clamp enable signal Clmp_en. PMOS transistor P3, connected between PMOS transistor P2 and a gate of NMOS transistor n2, has a gate to receive clamp voltage control signal Vclmp_con.

PMOS transistor P4, connected between power voltage VDD terminal and NMOS transistor N2, has a gate to receive clamp enable signal Clmp_en. NMOS transistor N2, connected between PMOS transistor P4 and clamp bit line CBL1, has a gate connected to clamp voltage Vclmp terminal. NMOS transistor N3, connected between clamp voltage Vclmp terminal and ground voltage terminal, has a gate to receive clamp enable signal Clmp_en.

The operation of clamp voltage generating unit 50 is explained as follows.

The reference bias unit 51 is configured to generate a reference voltage for generating clamp voltage Vclmp. Reference bias unit 51 sets a load value so that a current value of clamp reference signal Cref1 flowing into clamp bit line CBL0 may be constant.

Clamp bias unit 51 is activated by clamp enable signal Clmp_en. A given target current value is determined by NMOS transistor N1.

Clamp voltage adjusting unit 52 is an amplifying circuit configured to receive clamp reference signal Cref1 so that clamp reference signal Cref2 is determined. That is, amplifier A adjusts clamp reference signal Cref2 in response to clamp reference signal Cref1 to output clamp voltage control signal Vclmp_con.

Clamp voltage output unit 53 is configured to control output of clamp voltage Vclmp. Clamp voltage output unit 53 is activated by clamp enable signal Clmp_en.

When clamp enable signal Clmp_en is inactivated to a high level, NMOS transistor N3 is turned on to maintain clamp voltage Vclmp at the ground voltage level. When clamp enable signal Clmp_en is activated to a low level, PMOS transistors P1, P2, P4 are activated.

PMOS transistor P3 can control clamp voltage Vclmp in response to clamp voltage control signal Vclmp_con. NMOS transistor N2 determines a voltage of clamp reference signal Cref2 depending on clamp voltage Vclmp.

Clamp reference signal Cref2 is inputted into the positive (+) terminal of amplifier A and controls clamp voltage Vclmp. As a result, clamp reference signals Cref1, Cref2 maintain a given offset voltage.

Figure 10:
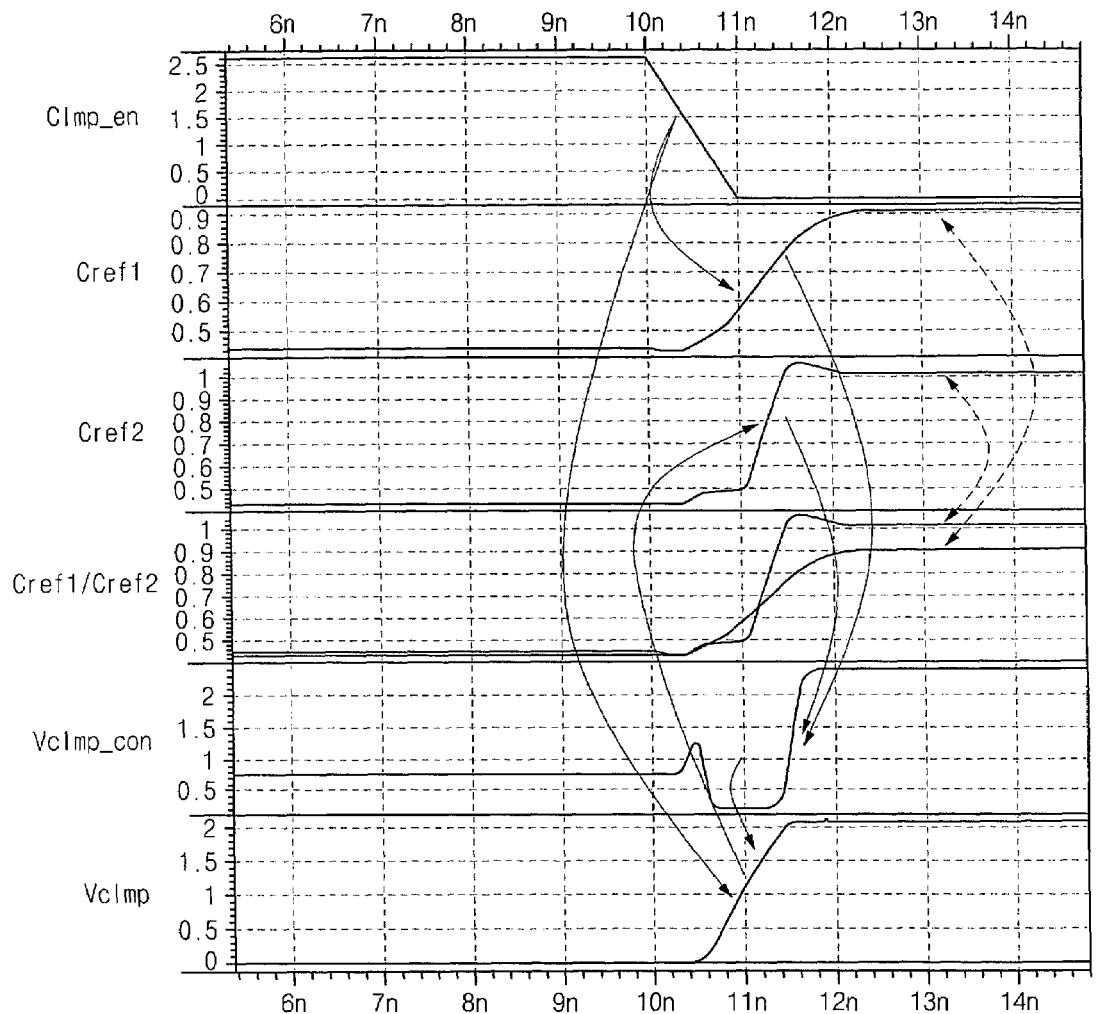
FIG. 10 is a timing diagram illustrating the clamp voltage generating unit of FIG. 9 consistent with the present invention.

FIG. 10 is a timing diagram illustrating the clamp voltage generating unit 50 of FIG. 9 consistent with the present invention.

At a standby state, clamp enable signal Clmp_en is kept inactivated at the high level. As a result, clamp reference signals Cref1, Cref2, clamp voltage control signal Vclmp_con and clamp voltage Vclmp are kept 'low'.

When clamp enable signal Clmp_en is activated to a low level, PMOS transistor P1 is turned on. As a result, a voltage of clamp reference signal Cref1 rises to a given bias voltage level.

A voltage of clamp reference signal Cref2 rises after a given time so that clamp voltage control signal Vclmp_con becomes 'low'. PMOS transistor P3 is turned on in response to clamp voltage control signal Vclmp_con so that a level of clamp voltage Vclmp rises.

When clamp voltage Vclmp rises, clamp reference signal Cref2 starts to rise. When a voltage difference of clamp reference signals Cref1, Cref2 reaches a target offset voltage, a voltage of clamp voltage control signal Vclmp_con rises to a high level. As a result, level of the clamp voltage Vclmp rises no longer.

Figure 11:
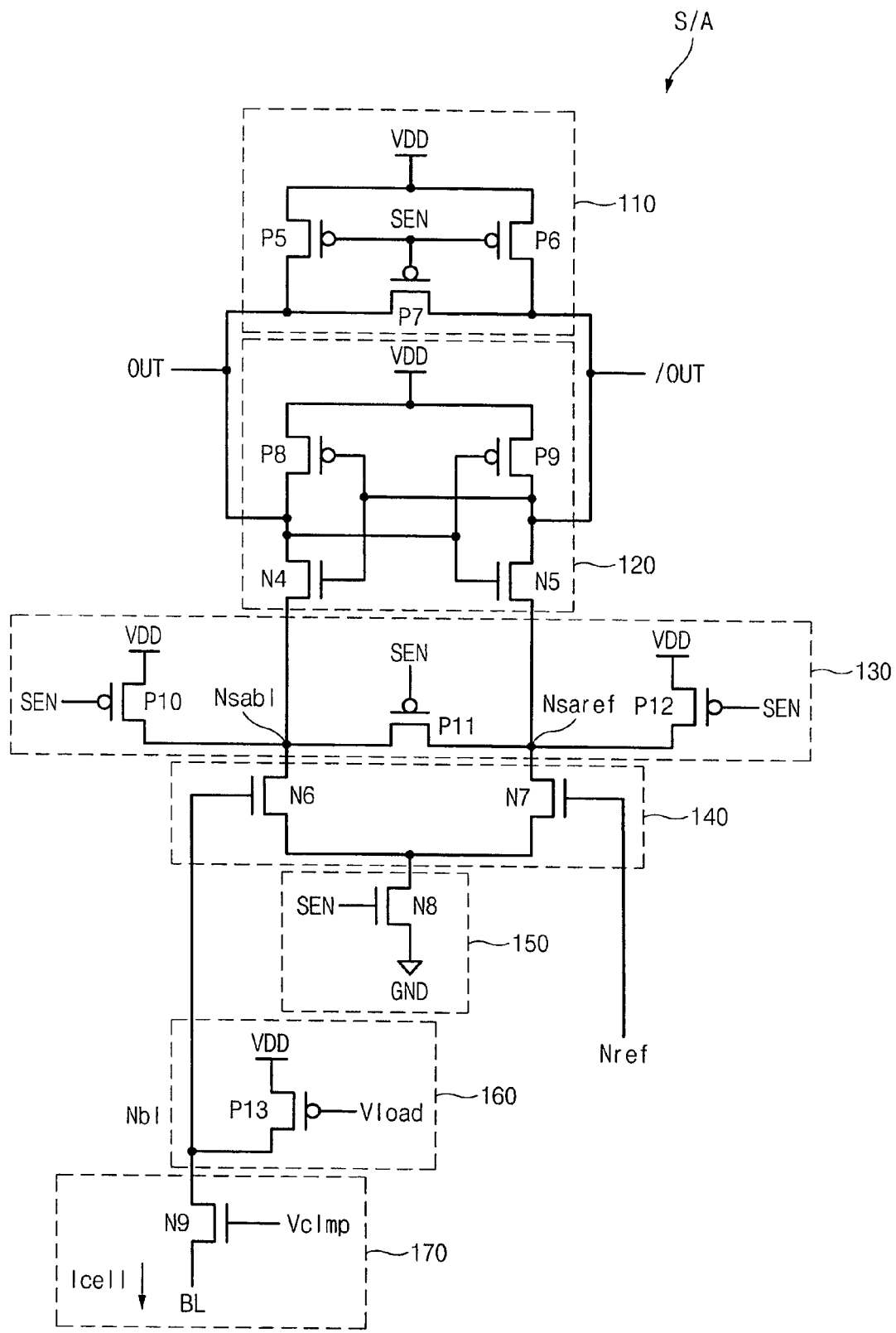
FIG. 11 is a circuit diagram illustrating a current sense amplifier of FIGS. 5 and 6 consistent with the present invention.

FIG. 11 is a circuit diagram illustrating current sense amplifier S/A of FIGS. 5 and 6.

Sense amplifier S/A includes an equalizing unit 110, an amplifying unit 120, a pull-up unit 130, an amplifying unit 140, an amplifying activation control unit 150, a current sensing load unit 160 and a bit line voltage bias control unit 170.

Equalizing unit 110 includes PMOS transistors P5~P7. PMOS transistor P5 is connected between power voltage VDD terminal and an output terminal OUT. PMOS transistor P6 is connected between power voltage VDD terminal and an output terminal /OUT. PMOS transistor P7 is connected between the output terminals OUT, /OUT. PMOS transistors P5~P7 have a common gate to receive a sense amplifier enable signal SEN.

Amplifying unit 120 includes PMOS transistors P8, P9 and NMOS transistors N4, N5. PMOS transistors P8, P9 are cross-coupled with NMOS transistors N4, N5.

Pull-up unit 130 includes PMOS transistors P10~P12. PMOS transistor P10 is connected between power voltage VDD terminal and a node Nsabl. PMOS transistor P11 is connected between node Nsabl and a node Nsaref. PMOS transistor P12 is connected between power voltage VDD terminal and node Nsaref. PMOS transistors P10~P12 have a common gate to receive sense amplifier enable signal SEN.

Amplifying unit 140 includes NMOS transistors N6, N7. NMOS transistor N6 connected between node Nsabl and NMOS transistor N8, has a gate connected to a node Nbl. NMOS transistor N7, connected between node Nsaref and NMOS transistor N8, has a gate to receive the reference voltage Nref.

Amplifying activation control unit 150, connected between amplifying unit 140 and ground voltage GND terminal, has a gate to receive sense amplifier enable signal SEN.

Current sensing load unit 160 includes a PMOS transistor P13. The PMOS transistor P13, connected between the power voltage VDD terminal and the node Nbl, has a gate to receive a load voltage Vload.

Bit line voltage bias control unit 170 includes a NMOS transistor N9. NMOS transistor N9, connected between node Nbl and bit line BL, has a gate to receive clamp voltage Vclmp.

Figure 12:
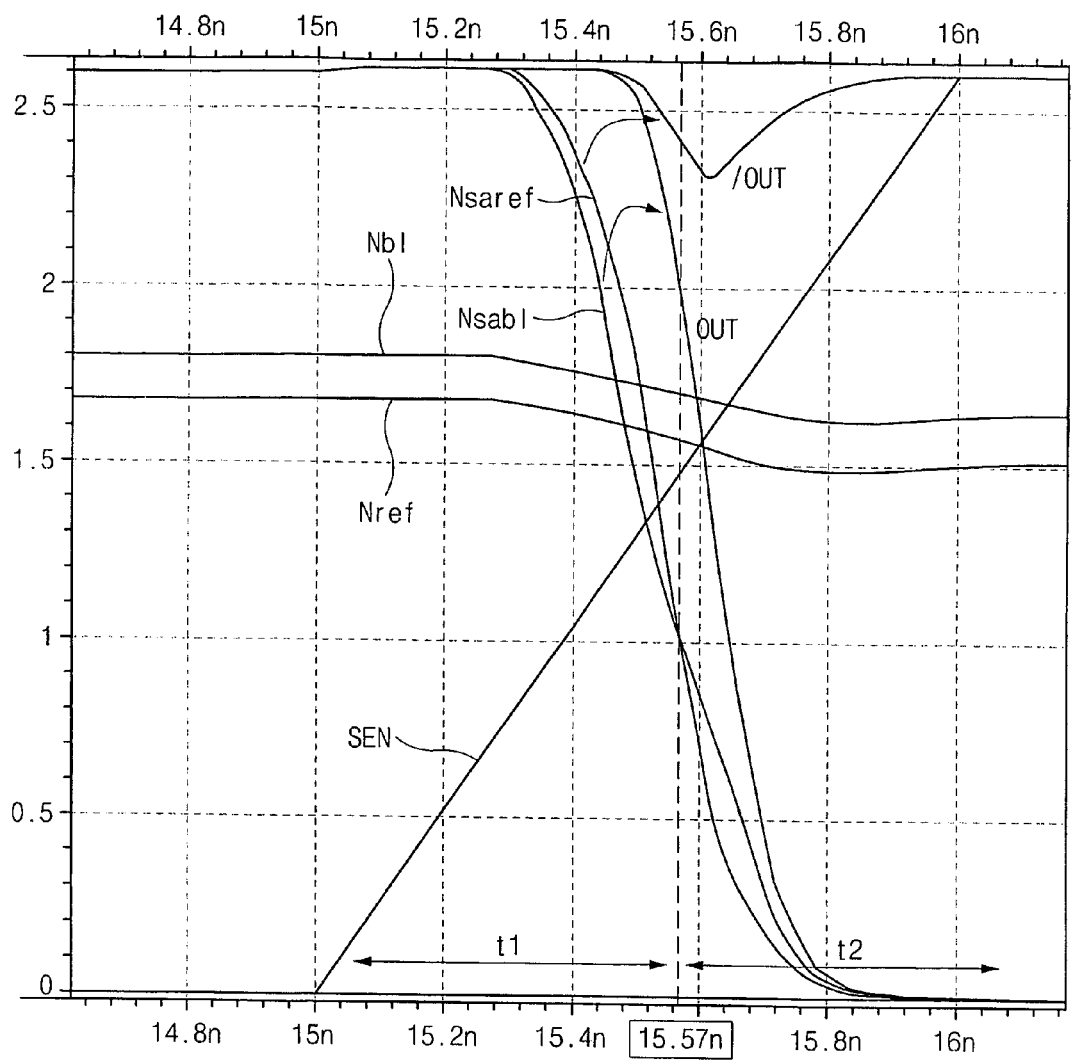
FIG. 12 is a waveform diagram illustrating first and second amplifying terminals in the current sense amplifier of FIG. 11 consistent with the present invention.

FIG. 12 is a waveform diagram illustrating the current sense amplifier S/A of FIG. 11.

When clamp voltage Vclmp rises, NMOS transistor N9 is turned on to transmit a bit line current of the main cell into the node Nbl. A gate voltage of the NMOS transistor N9 is controlled by the clamp voltage Vclmp.

Current sensing load unit 160 includes a PMOS transistor P13 controlled by the load voltage Vload. A current of bit line BL is converted into a sensing voltage value in the node Nbl by a load value of PMOS transistor P13.

Amplifying activation control unit 150 is controlled by sense amplifier enable signal SEN. Amplifying units 120 and 140 are activated depending on a state of amplifying activation control unit 150. Amplifying unit 140 amplifies voltages of the node Nbl and the reference voltage Nref using gains of NMOS transistors N6, N7.

Both nodes Nsabl, Nsaref terminals are pre-charged to a high level depending on the operation of pull-up unit 130 during a pre-charge period. As a result, an amplifying characteristic of sense amplifier S/A is improved. That is, both nodes Nsabl, Nsaref terminals are pulled down in the period t1 to have an amplified voltage value. The voltage amplified in the amplifying unit 140 is transmitted into the amplifying unit 120 to improve of amplifying characteristic a second amplifying unit.

Amplifying unit 120 amplifies the gains of the amplifying unit 140 to improve an offset characteristic of the sense amplifier S/A. The equalizing unit 110 precharges an output signal of the amplifying unit 120 to a high level during the precharge period.

Figure 13:
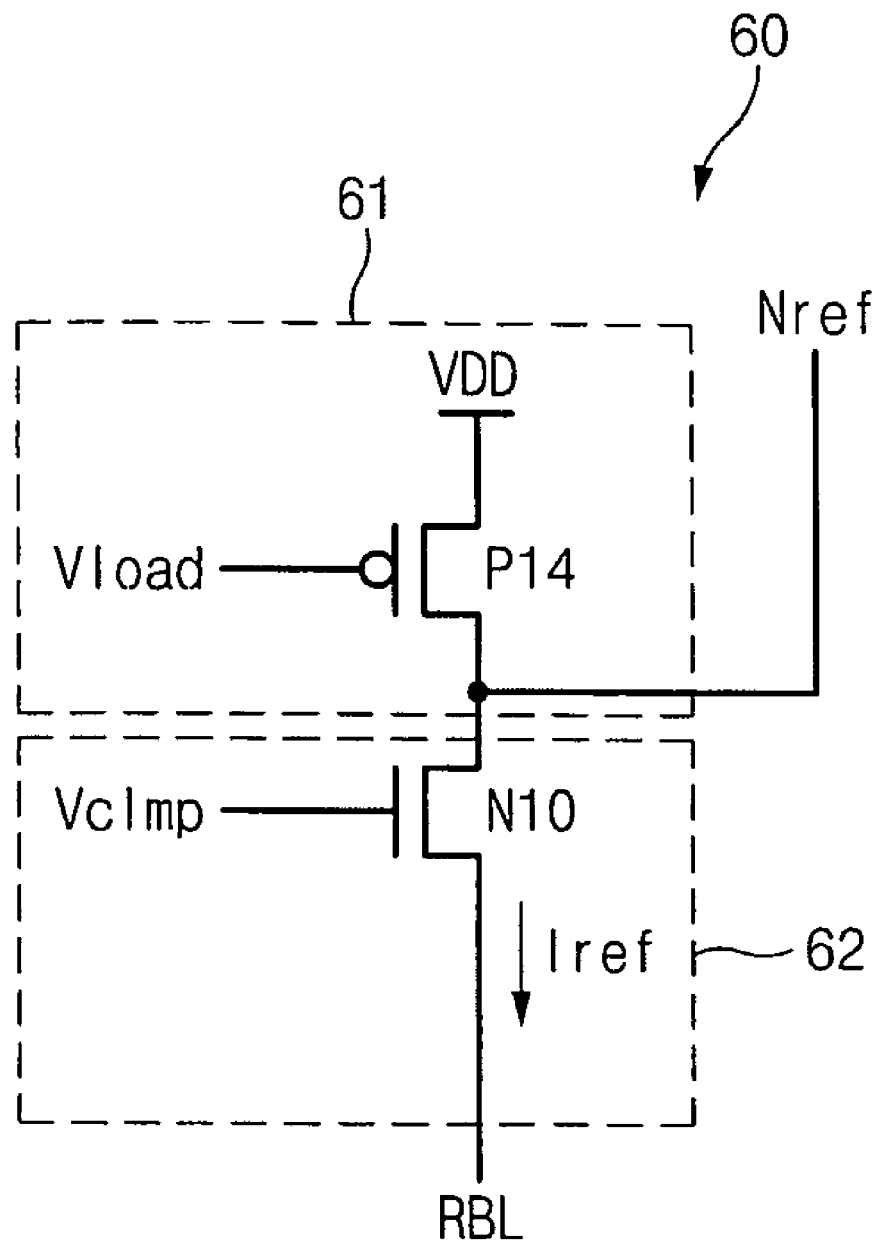
FIG. 13 is a circuit diagram illustrating a reference voltage generating unit of FIGS. 5 and 6 consistent with the present invention.

FIG. 13 is a circuit diagram illustrating reference voltage generating units 60 and 100 of FIGS. 5 and 6. Reference voltage generating unit 60 is exemplified.

Reference voltage generating unit 60 includes a current sensing load unit 61 and a bit line voltage bias control unit 62.

Current sensing load unit 61 includes a PMOS transistor P14. PMOS transistor P14, connected between power voltage VDD terminal and reference voltage Nref terminal, has a gate to receive load voltage Vload.

Bit line voltage bias control unit 62 includes a NMOS transistor N10. NMOS transistor N10, connected between reference voltage Nref terminal and reference bit line RBL, has a gate to receive clamp voltage Vclmp.

In the reference voltage generating unit 60, a gate voltage of NMOS transistor N10 is controlled by clamp voltage Vclmp. Reference current Iref is converted into a reference voltage value in reference voltage Nref terminal by a load value of PMOS transistor P14.

Figure 14:
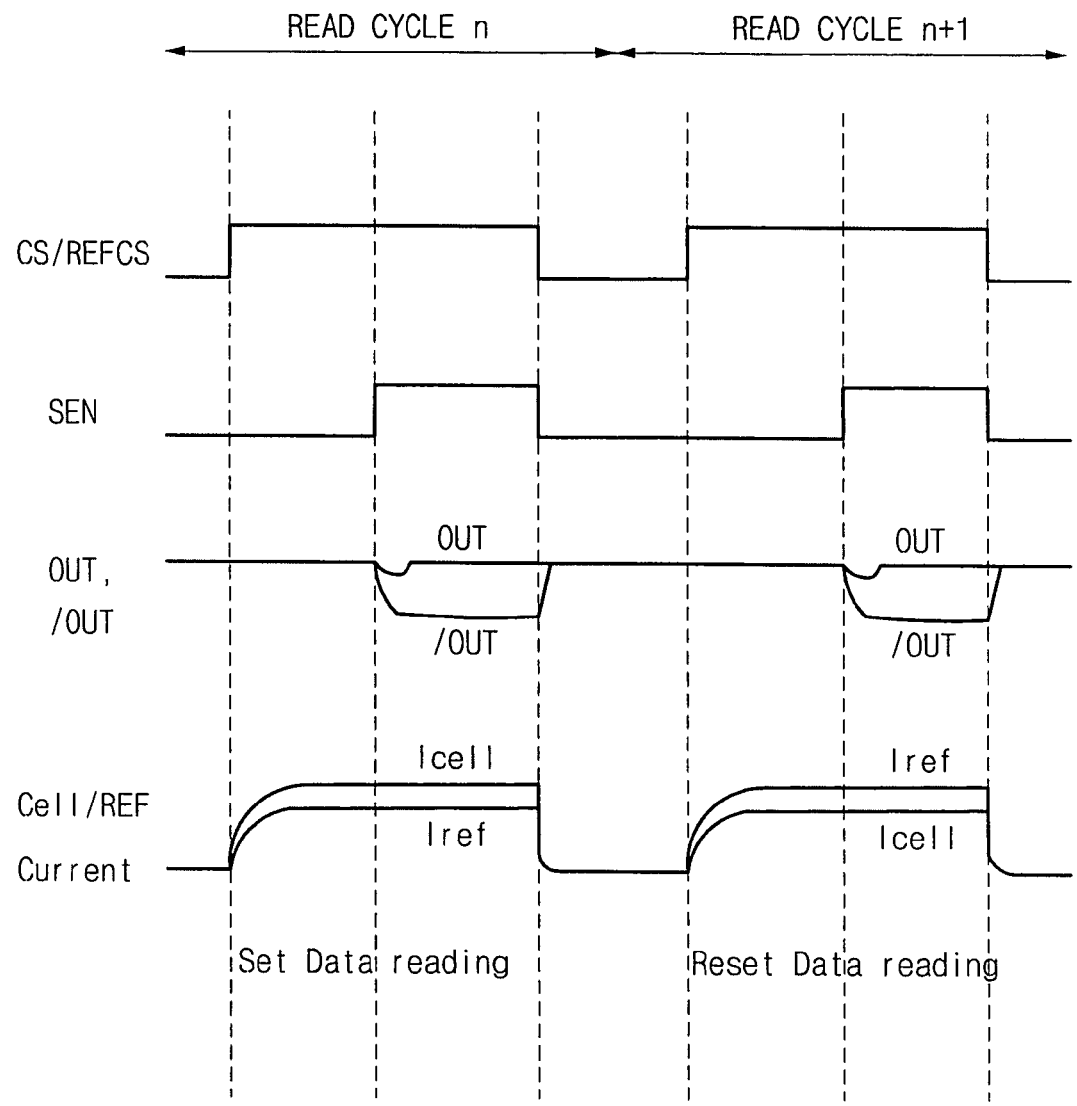
FIG. 14 is a timing diagram illustrating an operating voltage in the current sense amplifier of FIG. 11 consistent with the present invention.

FIG. 14 is a timing diagram illustrating an operating voltage in the current sense amplifier S/A of FIG. 11. FIG. 14 shows the current sensing operation of the data "1" and "0" in two read cycles.

In a read cycle n, when a column selecting switch CS and a reference column selecting switch REFCS are activated, a cell current and a reference REF current start to flow. After a given time, a voltage of the output terminals OUT, /OUT is amplified when sense amplifier enable signal SEN is activated. Since the cell current Icell is larger than the reference current Iref, the output terminal OUT is outputted as a high level and the output terminal /OUT is outputted as a low level.

In a read cycle n+1, when column selecting switch CS and reference column selecting switch REFCS are activated, the cell current and the reference REF current start to flow. After a given time, a voltage of the output terminals OUT, /OUT is amplified when sense amplifier enable signal SEN is activated. Since the cell current Icell is smaller than the reference current Iref, the output terminal OUT is outputted as a low level and the output terminal /OUT is outputted as a high level.

Figure 15:
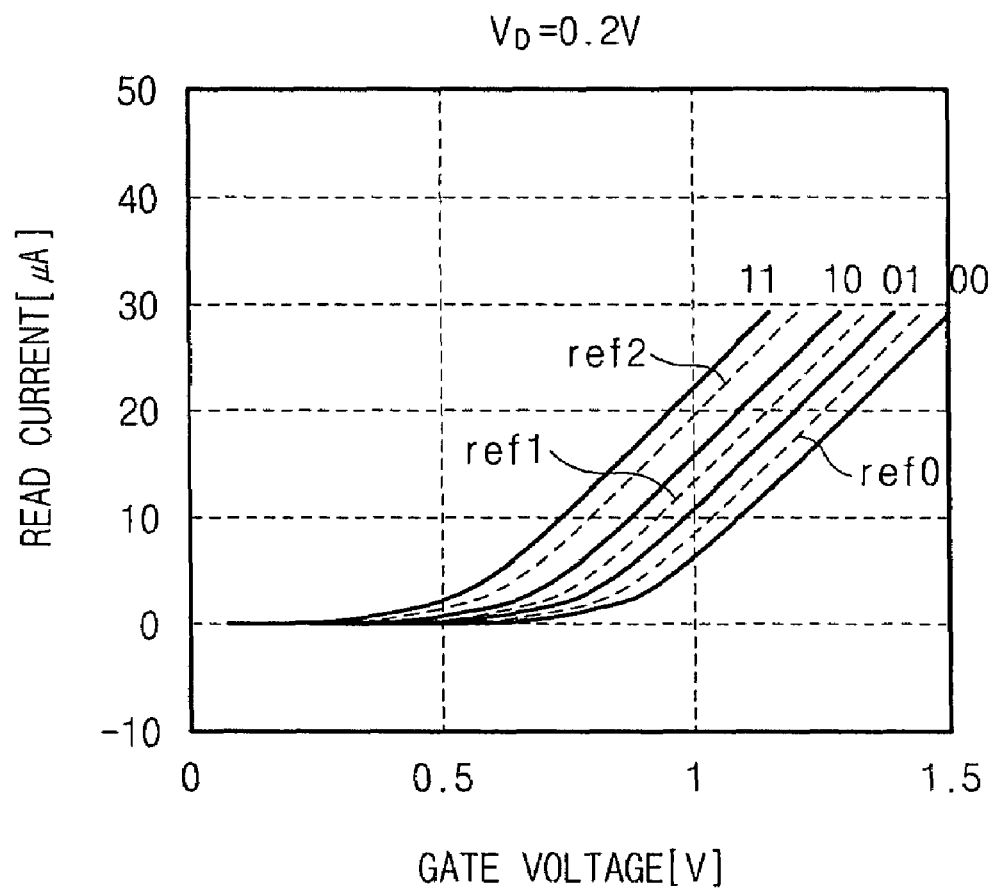
FIG. 15 is a waveform diagram illustrating a characteristic of a cell read current of a one-transistor type DRAM consistent with the present invention.

FIG. 15 is a waveform diagram illustrating a characteristic of a multi level read current of a one-transistor type DRAM consistent with the present invention.

The graph of FIG. 15 illustrates a cell write current when a cell gate voltage is swept while a cell drain voltage Vd is 0.2V, a cell source voltage is grounded in a DRAM cell of the SOI wafer 10. The embodiment depicts 2 bit data stored using 4 level currents.

When a word line read voltage is applied to word line WL, a read current flows from bit line BL into source line SL. The data "11" is read when the amount of flowing sensing current is larger than a reference current ref2, and the data "10" is read when it is larger than a reference current ref1. The data "01" is read when a read current value is larger than the reference current ref0, and the data "00" is read when it is smaller than the reference current ref0.

Current level of the data "11" is the highest, and the current level of the data "10" is lower than that of the data "11". The current level of the data "01" is lower than that of the data "10". The current level of the data "00" is lower than that of the data "01". Values of the reference currents ref0, ref1, ref2 exist among the 4 level currents to perform a read operation of multi level data.

Figure 16:
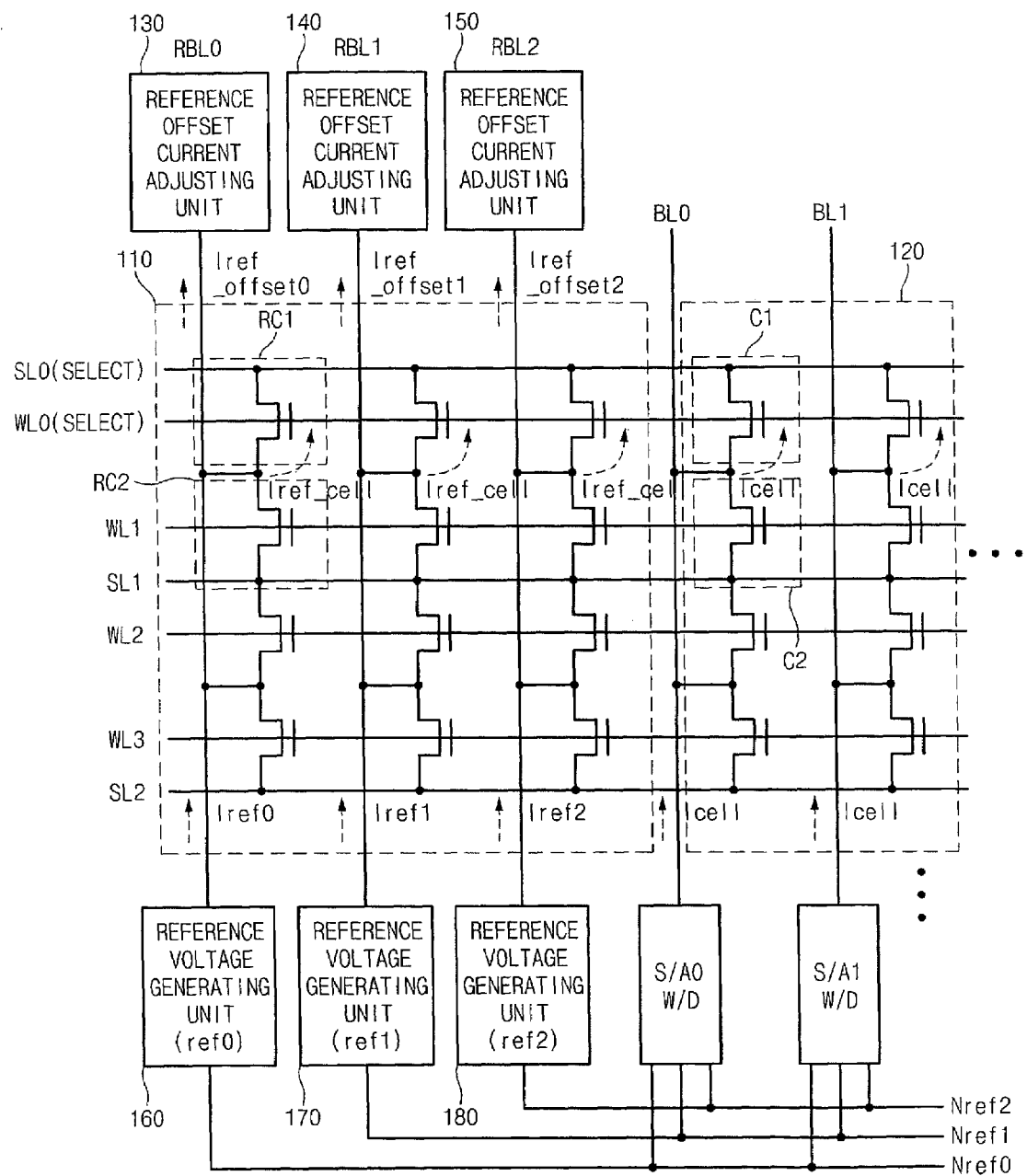
FIGS. 16 and 17 are diagrams illustrating a one-transistor type DRAM consistent with the present invention.

FIG. 16 is a diagram illustrating a one-transistor type DRAM consistent with the present invention. FIG. 16 shows when 2 bit data are stored using 4 level currents.

One-transistor type DRAM of FIG. 16 comprises a reference cell array 110, a cell array 120, a cell array 30, a plurality of reference offset current adjusting units 130~150, a plurality of reference voltage generating units 160~180, a sense amplifier S/A and a write driving unit W/D.

Reference cell array 110 includes a plurality of source lines SL0~SL2 and a plurality of word lines WL0~WL3 which are arranged in a row direction. A plurality of reference bit lines RBL0~RBL2 are arranged in a column direction. Reference cell array 110 includes reference cells RC1, RC2 which reflect a characteristic of main cell to generate a plurality of reference voltages Nref0~Nref2, thereby increasing efficiency of the sense amplifier.

In reference cell array 110, the reference cells RC1, RC2, connected between the source line SL0 and the source line SL1, have a common drain to share the reference bit line RBL0. Reference cells RC1, RC2 have a gate connected to word lines WL0, WL1. Reference cells RC1, RC2 arranged up and down have a source connected to the different source lines SL0, SL1.

Cells of the reference cell array 110 store data "0". The same current as that of the data "0" flows through the plurality of reference bit lines RBL0~RBL2.

Cell array 120 includes the plurality of source lines SL0~SL2 and the plurality of word lines WL0~WL3 which are arranged in a row direction. A plurality of bit lines BL0, BL1 are arranged in a column direction.

In the cell array 120, cells C1, C2, connected between the source line SL0 and the source line SL1, have a common drain to share the bit line BL0. The cells C1, C2 have a gate connected to the word lines WL0, WL1. The cells C1, C2 arranged up and down have a source connected to the different source lines SL0, SL1.

The source line sensing voltage Vslsense, which is a sensing bias voltage for sensing a sensing current of the cell, is applied between the bit line BL and the source line SL. As a result, the cell sensing current Icell flows depending on a storage state of cell data.

The reference offset current adjusting units 130~150 are connected one-by-one to the reference bit lie RBL0~RBL2 and configured to adjust a plurality of reference offset currents Iref_offset0~Iref_offset2 flowing in the referent bit lines RBL0~RBL2.

The reference voltage generating units 160~180 are connected one-by-one to the reference bit lines RBL0~RBL2. The reference voltage generating units 160~180 control reference currents Iref0~Iref2 flowing the reference bit line RBL0~RBL2 to generate a plurality of reference voltages Nref0~Nref2.

Bit lines BL0, BL1 are connected one-by-one to the sense amplifier S/A and the write driving unit W/D. The sense amplifier S/A and the write driving unit W/D receive the reference voltages Nref0~Nref2 for distinguishing sensing voltages to control the cell current Icell.

The sense amplifier S/A senses the cell data to distinguish the data "11", the data "10", the data "01", and the data "00". The write driving unit W/D supplies a driving voltage corresponding to write data to the bit line BL when data are written in the cell.

Figure 17:
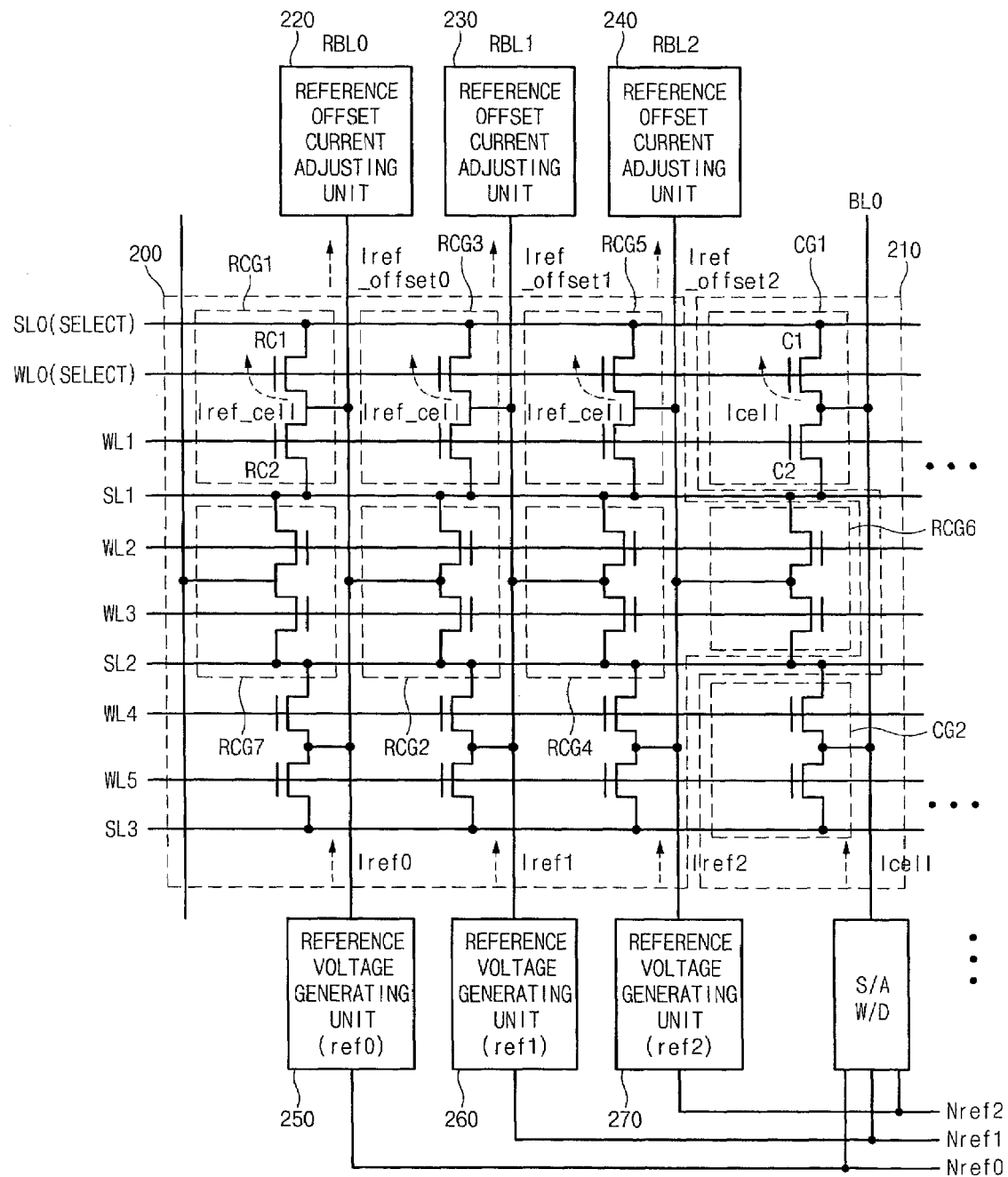

FIG. 17 is a diagram illustrating a one-transistor type DRAM consistent with the present invention.

The one-transistor type DRAM of FIG. 17 comprises a reference cell array 200, a cell array 210, a plurality of reference offset current adjusting units 220~240, a plurality of reference voltage generating units 250~270, a sense amplifier S/A and a write driving unit W/D.

Reference cell array 200 includes a plurality of source lines SL0~SL3 and a plurality of word lines WL0~WL5 which are arranged in a row direction. A plurality of reference bit lines RBL0~RBL2 are arranged in a column direction.

In the reference cell array 200, reference cells RC1, RC2, connected between source line SL0 and source line SL1, have a common drain to share reference bit line RBL0. Reference cells RC1, RC2 have a gate connected to word lines WL0, WL1. The reference cells RC1, RC2 arranged up and down have a source connected to the different source lines SL0, SL1.

Cells of the reference cell array 200 store data "0". The same current as that of the data "0" flows through plurality of reference bit lines RBL0~RBL2.

Cell array 210 includes the plurality of source lines SL0~SL3 and the plurality of word lines WL0~WL5 which are arranged in a row direction. A plurality of bit lines BL0, BL1 are arranged in a column direction.

In the cell array 210, cells C1, C2, connected between source line SL0 and source line SL1, have a common drain to share bit line BL0. Cells C1, C2 have a gate connected to word lines WL0, WL1. Cells C1, C2 arranged up and down have sources connected to different source lines SL0, SL1, respectively.

Source line sensing voltage Vslsense, which is a sensing bias voltage for sensing a sensing current of the cell, is applied between bit line BL and source line SL. As a result, the cell sensing current Icell flows depending on a storage state of cell data.

The reference offset current adjusting units 220~240 are connected one-by-one to reference bit line RBL0~RBL2 and configured to adjust a plurality of reference offset currents Iref_offset0~Iref_offset2 flowing into reference bit lines RBL0~RBL2.

Reference voltage generating units 250~270 are connected one-by-one to reference bit lines RBL0~RBL2. Reference voltage generating units 250~270 control reference currents Iref0~Iref2 flowing into reference bit line RBL0~RBL2 to generate a plurality of reference voltages Nref0~Nref2.

Bit lines BL0, BL1 are connected one-by-one to sense amplifier S/A and write driving unit W/D. Sense amplifier S/A and write driving unit W/D receive the reference voltages Nref0~Nref2 for distinguishing sensing voltages to control the cell current Icell.

Sense amplifier S/A senses the cell data to distinguish the data "11", the data "10", the data "01", and the data "00". The write driving unit W/D supplies a driving voltage corresponding to write data to bit line BL when data are written in the cell.

Reference cell array 200 includes reference cell groups RCG1 and RCG2 connected to reference bit line RBL0, reference cell groups RCG3 and RCG4 connected to reference bit line RBL1, and reference cell groups RCG5 and RCG6 connected to reference bit line RBL2. Cell array 210 includes a plurality of cell groups CG1, CG2 connected to bit line BL.

Reference cell groups RCG1, RCG2 connected to reference bit line RBL0 may be alternately arranged in row and column directions.

Reference cell groups RCG3, RCG4 connected to reference bit line RBL1 may be alternately arranged in row and column directions.

Reference cell groups RCG5, RCG6 connected to reference bit line RBL2 may be alternately arranged in row and column directions. A plurality of cell groups CG1, CG2 connected to bit line BL are arranged alternately in row and column directions.

Source line SL1 may be shared by the reference cell groups RCG1, RCG2 arranged up and down. The reference cell groups RCG1, RCG3, RCG5 arranged in the same row line and the cell group CG1 are shared by the source line SL1.

Reference cell groups RCG2, RCG3 arranged up and down based on the source line SL1 from the reference cell groups RCG2, RCG3 arranged in the same column line are connected to the reference bit lines RBL0 and RBL1. That is, the reference cell group RCG3 arranged over the source line SL1 is connected to the reference bit line RBL1, and the reference cell group RCG2 arranged below the source line SL1 is connected to the reference bit line RBL0.

When several cells arranged up and down share the same bit line, a bias voltage is applied to bit line BL while source line SL1 is shared in a write mode. The same voltage is applied to floating body cells arranged up and down. As a result, the same bias voltage is applied to selected cells and unselected cells so that an operating error occurs in the unselected cells.

The cell groups CG3, CG2 arranged up and down are connected to the reference bit lines RBL1, RBL0. The bias voltage is applied to the selected cells, and the bias voltage from the bit line is not applied in the unselected cells, thereby preventing an operating error of the cell.

A reference cell group RCG7 is not connected to reference bit line RBL, but is disposed in the cell array to make process be convenience. A bias condition applied to each cell can be differentiated by changing the arrangement of the cell groups as shown in FIG. 17.

Figure 18:
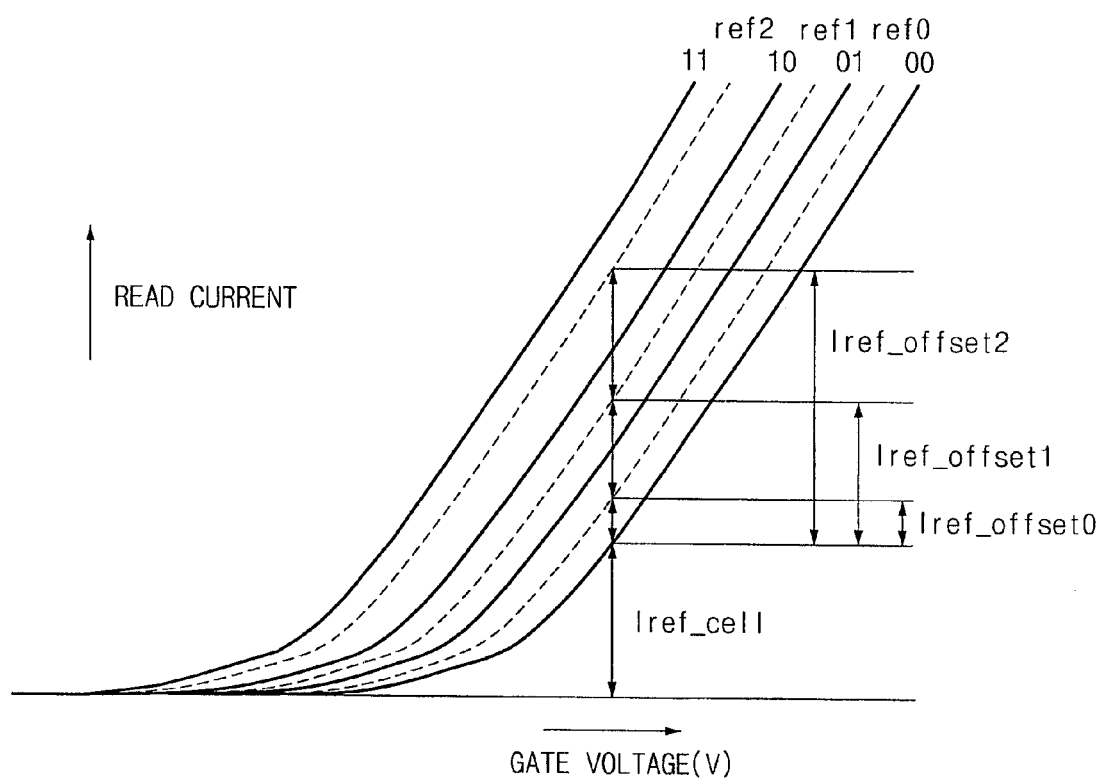
FIG. 18 is a waveform diagram illustrating a reference current of a one-transistor type DRAM consistent with the present invention.

FIG. 18 is a waveform diagram illustrating a reference current of a one-transistor type DRAM consistent with the present invention.

In the sensing period t1 of FIG. 4b, when the voltage of word line WL transits to word line sensing voltage Vwlsense level, the same reference current Iref_cell as that of the data "0" flows in the reference cell RC of the reference cell array 110.

In the reference offset current adjusting unit 130, an additional current element is generated to generate the reference current Iref0 corresponding to a middle value of the cell data "00" and the cell data "01". The additional current element is defined by the reference offset current Iref_offset0.

In the reference offset current adjusting unit 140, an additional current element is generated to generate the reference current Iref1 corresponding to a middle value of the cell data "01" and the cell data "10". The additional current element is defined by the reference offset current Iref_offset1.

In the reference offset current adjusting unit 150, an additional current element is generated to generate the reference current Iref2 corresponding to a middle value of the cell data "10" and the cell data "11". The additional current element is defined by the reference offset current Iref_offset2.

The whole reference current Iref0 includes the reference current Iref_cell and the reference offset current Iref_offset0. The whole reference current Iref1 includes the reference current Iref_cell and the reference offset current Iref_offset1. The whole reference current Iref2 includes the reference current Iref_cell and the reference offset current Iref_offset2.

Figure 19A:
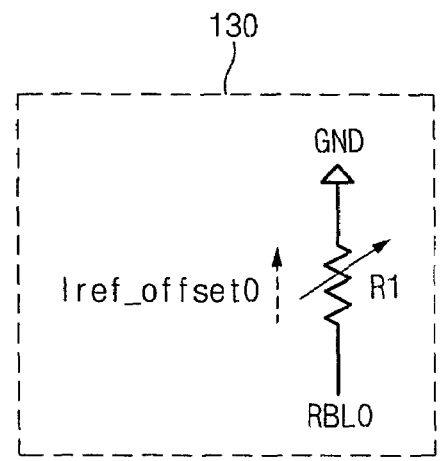
FIGS. 19a to 19c are circuit diagrams illustrating a reference offset current adjusting unit of FIGS. 16 and 17 consistent with the present invention.
Figure 19B:
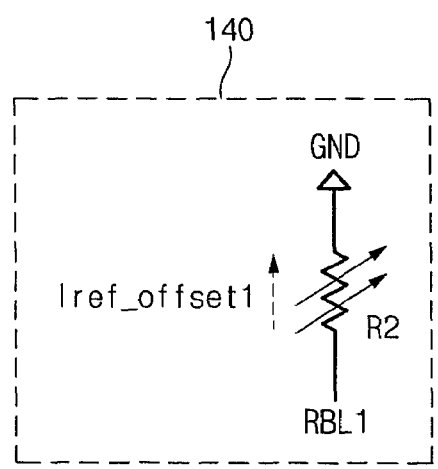
Figure 19C:
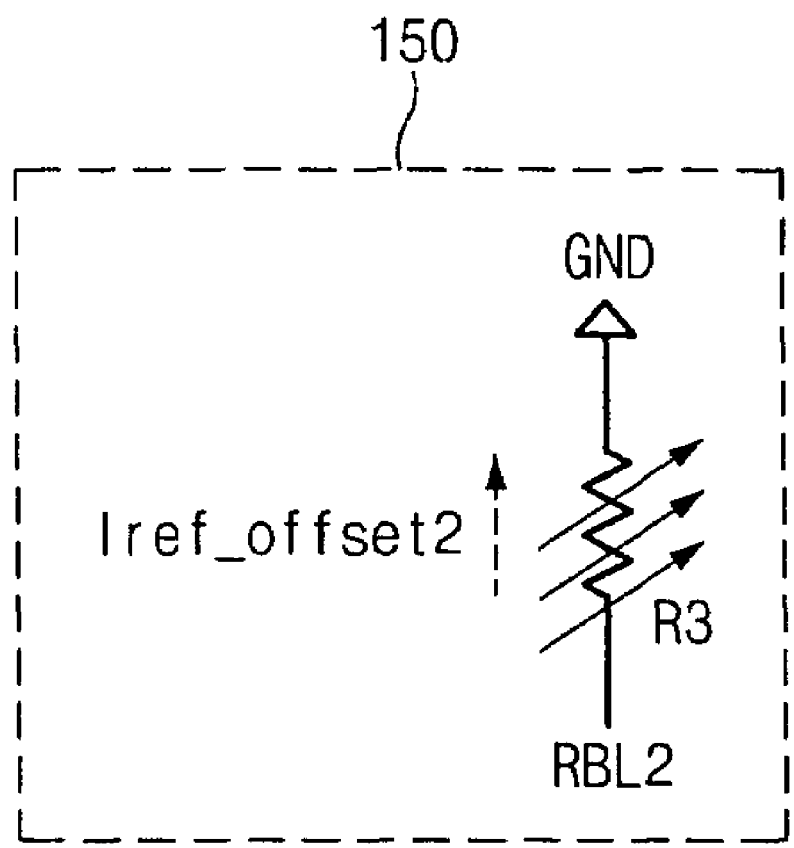

FIGS. 19a to 19c are circuit diagrams illustrating the reference offset current adjusting units 130~150 of FIGS. 16 and 17 consistent with the present invention.

Reference offset current adjusting unit 130 of FIG. 19a includes an offset current control element connected between reference bit line RBL0 and ground GND voltage terminal. The offset current control element adjusts flowing of the reference offset current Iref_offset0 flowing from the reference voltage generating unit 160 through reference bit line RBL0 to ground GND terminal.

Reference offset current adjusting unit 140 of FIG. 19b includes an offset current control element connected between reference bit line RBL1 and ground GND voltage terminal. The offset current control element adjusts flowing of the reference offset current Iref_offset1 flowing from reference voltage generating unit 170 through reference bit line RBL1 to ground GND terminal.

Reference offset current adjusting unit 150 of FIG. 19c includes an offset current control element connected between reference bit line RBL2 and ground GND voltage terminal. The offset current control element adjusts flowing of the reference offset current Iref_offset2 flowing from the reference voltage generating unit 180 through reference bit line RBL2 to ground GND terminal.

Although the offset current control element includes resistors R1~R3 having different resistance values in the embodiment, the offset current control element may be configured with a MOS element or any other elements whose resistance are adjusted.

Figure 20:
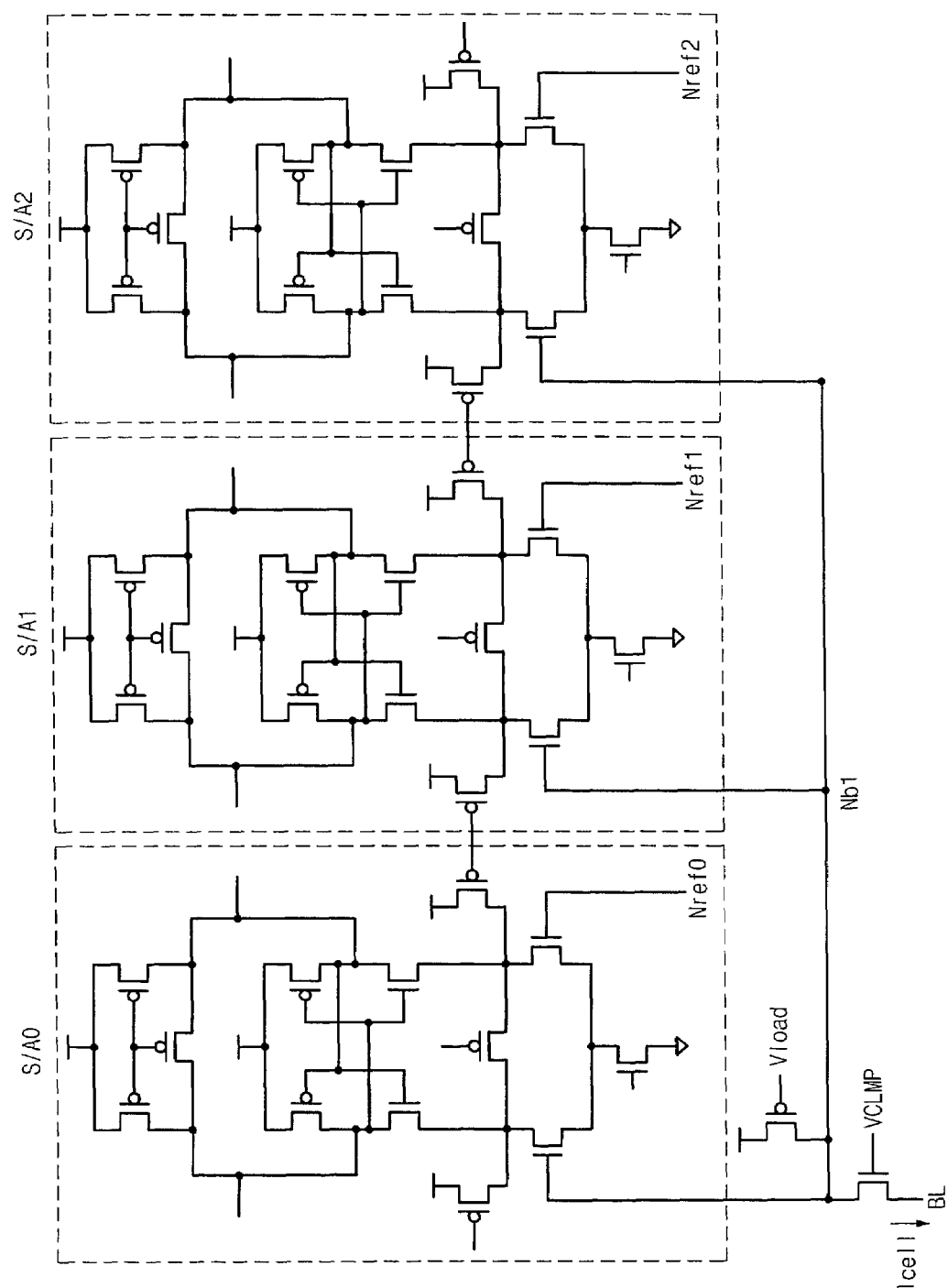
FIG. 20 is a circuit diagram illustrating a sense amplifier of FIGS. 16 and 17 consistent with the present invention.

FIG. 20 is a circuit diagram illustrating sense amplifiers S/A0~S/A2 of FIGS. 16 and 17 consistent with the present invention.

Three sense amplifiers S/A0~S/A2 are required to sense 4 level currents. Each of the sense amplifiers S/A0~S/A2 may receive a signal of the node Nbl and different reference voltages Nref0~Nref2. The bit line current Icell of the main cell is controlled by a clamp element and a load element. A signal voltage of the main cell is generated from the node Nbl. The detailed configuration of the sense amplifiers S/A0~S/A2 is shown in FIG. 11.

Figure 21A:
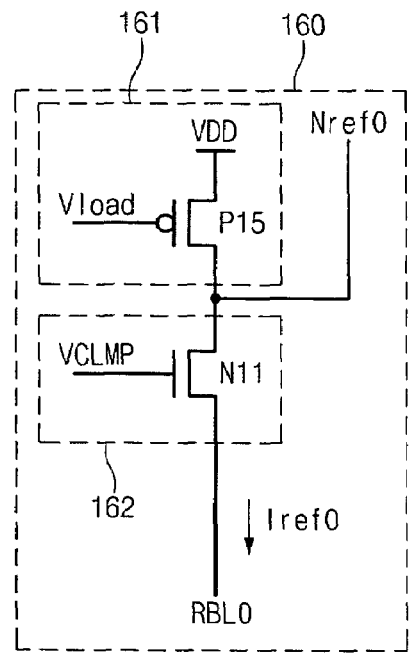
FIGS. 21a to 21c are circuit diagrams illustrating a reference voltage generating unit of FIGS. 16 and 17 consistent with the present invention.
Figure 21B:
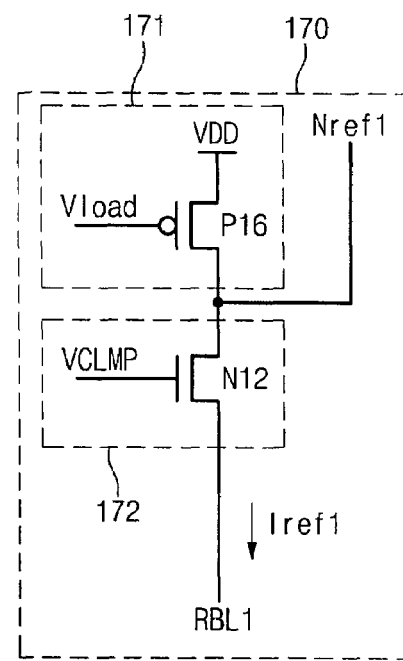
Figure 21C:
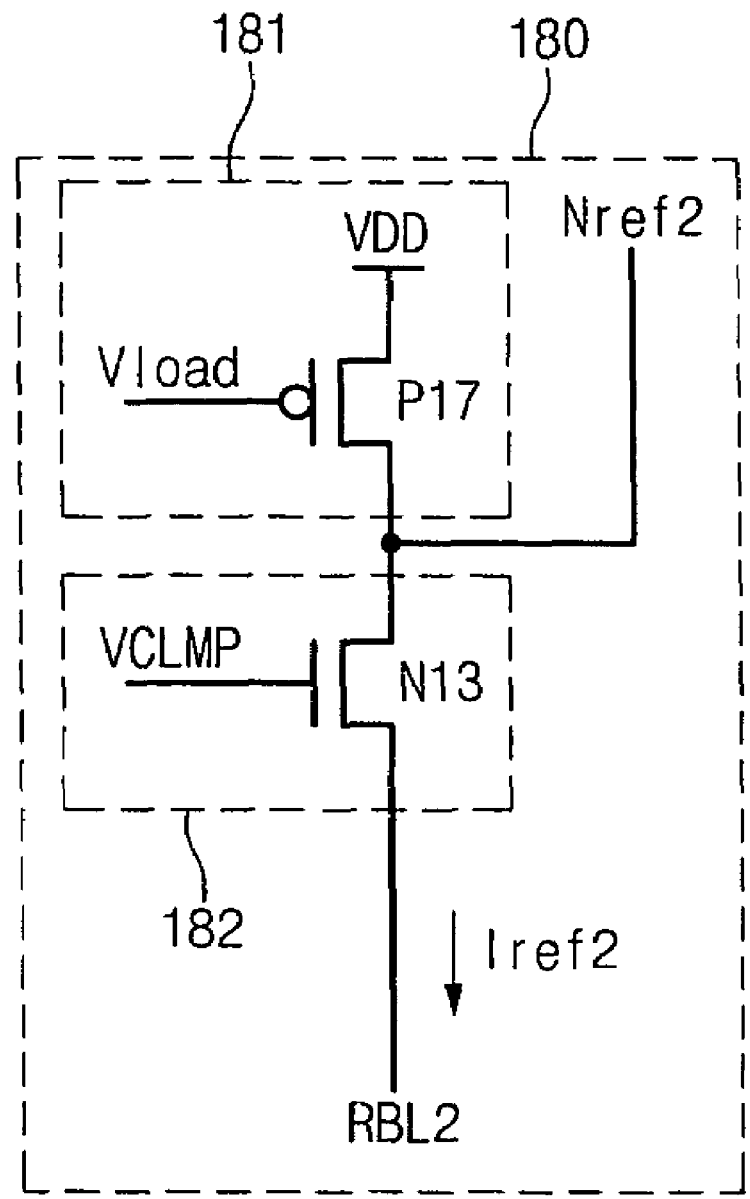

FIGS. 21a to 21c are circuit diagrams illustrating the reference voltage generating unit 160~180 of FIGS. 16 and 17.

The reference voltage generating unit 160 includes a current sensing load unit 161 and a bit line voltage bias control unit 162.

Current sensing load unit 161 includes a PMOS transistor P15. The PMOS transistor P15, connected between power voltage VDD terminal and reference voltage Nref0 terminal, has a gate to receive a load voltage Vload.

Bit line voltage bias control unit 162 includes a NMOS transistor N11. NMOS transistor N11, connected between the reference voltage Nref0 terminal and the reference bit line RBL0, has a gate to receive a clamp voltage VCLMP.

In the reference voltage generating unit 160, a gate voltage of the NMOS transistor N11 is controlled by clamp voltage VCLMP. The reference current Iref0 is converted into a reference voltage value in the reference voltage Nref0 terminal by a load value of PMOS transistor P15.

The reference voltage generating unit 170 includes a current sensing load unit 171 and a bit line voltage bias control unit 172.

Current sensing load unit 171 includes a PMOS transistor P16. PMOS transistor P16, connected between power voltage VDD terminal and reference voltage Nref1 terminal, has a gate to receive the load voltage Vload.

Bit line voltage bias control unit 172 includes a NMOS transistor N12. NMOS transistor N12, connected between reference voltage Nref1 terminal and reference bit line RBL1, has a gate to receive a clamp voltage VCLMP.

In the reference voltage generating unit 170, a gate voltage of the NMOS transistor N12 is controlled by the clamp voltage VCLMP. The reference current Iref1 is converted into a reference voltage value in the reference voltage Nref1 terminal by a load value of the PMOS transistor P16.

The reference voltage generating unit 180 includes a current sensing load unit 181 and a bit line voltage bias control unit 182.

Current sensing load unit 181 includes a PMOS transistor P17. PMOS transistor P17, connected between power voltage VDD terminal and reference voltage Nref2 terminal, has a gate to receive the load voltage Vload.

Bit line voltage bias control unit 182 includes a NMOS transistor N13. NMOS transistor N13, connected between reference voltage Nref2 terminal and reference bit line RBL2, has a gate to receive a clamp voltage VCLMP.

In the reference voltage generating unit 180, a gate voltage of the NMOS transistor N13 is controlled by the clamp voltage VCLMP. The reference current Iref2 is converted into a reference voltage value in the reference voltage Nref2 terminal by a load value of the PMOS transistor P17.

The clamp voltage VCLMP is applied to each of the reference voltage generating units 160~180 to form the same load condition in the reference bit lines RBL0~RBL2.

As described above, according to an embodiment consistent with the present invention, a one-transistor type DRAM including a floating body storage element is disclosed. One-transistor type DRAM including a floating body storage element may comprise generating a clamp voltage and a reference voltage which reflect a characteristic of a main cell, thereby improving sensing efficiency of a sense amplifier.

One-transistor type DRAM is applied with a Non-Destructive Read Out (NDRO) system not to destroy cell data in a read mode, thereby improving reliability of cells.

One-transistor type DRAM may reduce the cell size.

One-transistor type DRAM including a floating body storage element may generate a plurality of reference voltages that reflect a multi-bit data characteristic of a main cell using a reference cell array, thereby increasing the efficiency of the sense amplifier.

One-transistor type DRAM may be configured to read/write a plurality of data.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A one-transistor type DRAM including a floating body storage element connected between a bit line and a source line and controlled by a word line, the DRAM comprising:
   a plurality of source lines and word lines arranged in a row direction;
   a plurality of bit lines arranged in a column direction;
   a plurality of clamp bit lines and reference bit lines arranged in the column direction;
   a cell array including the floating body storage element and formed in a region where the source line, the word line and the bit line are crossed;
   a clamp cell array including the floating body storage element and formed in a region where the source line, the word line and the clamp bit line are crossed;
   a reference cell array including the floating body storage element and formed in a region where the source line, the word line and the reference bit line are crossed; and
   a sense amplifier and a write driving unit connected to the bit line and configured to receive a clamp voltage and a reference voltage.

2. The one-transistor type DRAM according to claim 1, wherein the clamp cell array and the reference cell array are configured to store data "0".

3. The one-transistor type DRAM according to claim 1, wherein the cell array includes a first cell and a second cell which are connected between a first source line and a second source line and configured to have a common drain connected to the bit line and a gate connected to a different word line.

4. The one-transistor type DRAM according to claim 3, wherein the clamp cell array includes:
   first and second clamp cells connected between the first source line and the second source line and configured to have a common drain connected to the clamp bit line and a gate connected to a different word line, wherein the reference cell array includes first and second reference cells which are connected between the first source line and the second source line and configured to have a common drain connected to the reference bit line and a gate connected to a different word line.

5. The one-transistor type DRAM according to claim 1, wherein the cell array includes a plurality of cell groups connected to the bit line, the cell groups including a first group connected to a first bit line and a second group connected to a second bit line.

6. The one-transistor type DRAM according to claim 5, wherein the first group and the second group are alternately arranged in row and column directions.

7. The one-transistor type DRAM according to claim 5, wherein the clamp cell array includes a plurality of clamp cell groups connected to the bit line, the clamp cell groups including a first group connected to a first clamp bit line and a second clamp group connected to a second clamp bit line.

8. The one-transistor type DRAM according to claim 5, wherein the reference cell array includes a plurality of reference cell groups connected to the reference bit line.

9. The one-transistor type DRAM according to claim 1, further comprising:
   a reference offset current adjusting unit configured to adjust an offset current of the reference bit line;
   a clamp voltage generating unit connected to the clamp bit line and configured to generate the clamp voltage; and
   a reference voltage generating unit connected to the reference bit line and configured to generate the reference voltage.

10. The one-transistor type DRAM according to claim 9, wherein a current flowing in the reference bit line includes a reference current of the cell and the offset current.

11. The one-transistor type DRAM according to claim 9, wherein the clamp voltage generating unit includes:
    a reference bias unit configured to supply a bias voltage to the clamp bit line;
    a clamp voltage adjusting unit configured to output a clamp voltage control signal for adjusting the clamp voltage corresponding to a voltage value of the clamp bit line; and
    a clamp voltage output unit configured to output the clamp voltage in response to the clamp voltage control signal.

12. The one-transistor type DRAM according to claim 9, wherein the reference voltage generating unit includes:
    a current sensing load unit configured to control the reference current depending on a load voltage; and
    a bit line voltage bias control unit configured to control the reference voltage flowing in the reference bit line depending on the clamp voltage.

* * * * *